United States Patent
Gambetta et al.

(10) Patent No.: US 11,244,241 B1
(45) Date of Patent: Feb. 8, 2022

(54) QUANTUM DEVICE FACILITATING A CROSS-RESONANCE OPERATION IN A DISPERSIVE REGIME

(71) Applicant: International Business Machines Corporation, Armonk, NY (US)

(72) Inventors: Jay Michael Gambetta, Yorktown Heights, NY (US); Jerry M. Chow, White Plains, NY (US); Easwar Magesan, Mount Kisco, NY (US); Abhinav Kandala, Yorktown Heights, NY (US); Zlatko K. Minev, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 22 days.

(21) Appl. No.: 17/027,324

(22) Filed: Sep. 21, 2020

(51) Int. Cl.
G06N 10/00 (2019.01)
H03K 19/195 (2006.01)

(52) U.S. Cl.
CPC ......... *G06N 10/00* (2019.01); *H03K 19/1952* (2013.01)

(58) Field of Classification Search
CPC ........................... G06N 10/00; H03K 19/1952
USPC .................................................. 327/527, 528
See application file for complete search history.

(56) References Cited

U.S. PATENT DOCUMENTS

| | | | |
|---|---|---|---|
| 10,256,206 B2 | 4/2019 | Falcon et al. | |
| 10,352,992 B1 | 7/2019 | Zeng et al. | |
| 10,374,612 B1* | 8/2019 | Sinclair | H03K 19/195 |
| 10,483,980 B2 | 11/2019 | Sete et al. | |
| 10,572,816 B1* | 2/2020 | Vavilov | H03K 19/195 |
| 11,106,991 B2* | 8/2021 | Jiang | G06N 10/00 |
| 2017/0193388 A1* | 7/2017 | Filipp | G06N 10/00 |
| 2018/0260731 A1 | 9/2018 | Zeng et al. | |
| 2019/0042967 A1 | 2/2019 | Yoscovits et al. | |

FOREIGN PATENT DOCUMENTS

WO 2018236922 12/2018

OTHER PUBLICATIONS

Sheldon et al., "Procedure for systematically tuning up crosstalk in the cross resonance gate," arXiv: 1603.04821v1 [quant-ph], Mar. 16, 2016, 6 pages.

Chow et al., "A simple all-microwave entangling gate for fixed-frequency superconducting qubits," arXiv: 1106.0553v1 [quant-ph], Jun. 2, 2011, 5 pages.

(Continued)

*Primary Examiner* — Tomi Skibinski
(74) *Attorney, Agent, or Firm* — Amin, Turocy & Watson, LLP

(57) ABSTRACT

Devices and/or computer-implemented methods to facilitate a cross-resonance operation in a dispersive regime of a qubit frequency space are provided. According to an embodiment, a device can comprise a first qubit having a first operating frequency and a first anharmonicity. The device can further comprise a second qubit that couples to the first qubit to perform a cross-resonance operation. The second qubit having a second operating frequency and a second anharmonicity. A detuning between the first operating frequency and the second operating frequency is larger than the first anharmonicity and the second anharmonicity.

25 Claims, 10 Drawing Sheets

(56) References Cited

OTHER PUBLICATIONS

Chow et al., "Implementing a strand of a scalable fault-tolerant quantum computing fabric," Nature Communications, Jun. 24, 2014, 9 pages.

Corcoles et al., "Demonstration of a quantum error detection code using a square lattice of four superconducting qubits," Nature Communications, Apr. 29, 2015, 10 pages.

Takita et al., "Demonstration of weight-four parity measurements in the surface code architecture," arXiv:1605.01351v3 [quant-ph], Apr. 28, 2017, 8 pages.

Magesan et al., "Effective Hamiltonian models of the cross-resonance gate," arXiv:1804.04073v2 [quant-ph], Feb. 25, 2019, 16 pages.

* cited by examiner

QUANTUM DEVICE FACILITATING A CROSS-RESONANCE OPERATION IN A DISPERSIVE REGIME

BACKGROUND

The subject disclosure relates to a quantum device facilitating a cross-resonance operation, and more specifically, to a quantum device facilitating a cross-resonance operation in a dispersive regime.

Fixed-frequency quantum bits (qubits), which have systematically demonstrated longer coherences, chiefly rely on the cross-resonance interaction for performing two-qubit gates. The speed, fidelity, and performance of the cross-resonance gate has so far been believed to be superior in the straddling regime, where the energy levels of the two qubits cross each other like two combs.

A problem with existing quantum technologies that implement the cross-resonance gate is that they operate the cross-resonance gate in the straddling regime, which leads to gate errors due to large static ZZ interactions and especially due to frequency collisions (e.g., often uncontrolled frequency collisions). The narrow spacing between the qubits (e.g., between operating frequencies of the qubits) that perform the cross-resonance gate in the straddling regime leads to many common frequency collisions and/or frequency crowding.

Another problem with such existing quantum technologies that implement the cross-resonance gate in the straddling regime is that they are not scalable because multi-qubit architectures lead to more gate errors due to greater static ZZ interactions and frequency collisions with spectator qubits (e.g., adjacent qubits) that further limit cross-resonance gate fidelity. A chief problem for scaling is that the current levels of control in Josephson junction fabrication are insufficient to mitigate the frequency crowding problem in such existing quantum technologies that implement the cross-resonance gate in the straddling regime. Systems with more than several hundred qubits appear infeasible with the current approach, due to the high chance of collisions caused by the narrow spacing of the qubit spectra.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, devices, computer-implemented methods, and/or computer program products that facilitate a cross-resonance operation in a dispersive regime of a qubit frequency space are described.

According to an embodiment, a device can comprise a first qubit having a first operating frequency and a first anharmonicity. The device can further comprise a second qubit that couples to the first qubit to perform a cross-resonance operation. The second qubit having a second operating frequency and a second anharmonicity. A detuning between the first operating frequency and the second operating frequency is larger than the first anharmonicity and the second anharmonicity. An advantage of such a device is that it can mitigate at least one of crosstalk or frequency collisions between at least one of the first qubit or the second qubit and an adjacent qubit.

In some embodiments, the device further comprises multiple qubits organized in a lattice. The multiple qubits including neighboring qubits to the first qubit and the second qubit. Based on a second detuning between two coupled qubits in the lattice being larger than anharmonicities of the two coupled qubits, static frequency collisions in the lattice are mitigated. An advantage of such a device is that it can mitigate at least one of crosstalk or frequency collisions between at least one of the first qubit or the second qubit and one or more adjacent qubits.

According to another embodiment, a computer-implemented method can comprise coupling, by a system operatively coupled to a processor, a first qubit having a first operating frequency and a first anharmonicity to a second qubit having a second operating frequency and a second anharmonicity. The computer-implemented method can further comprise performing, by the system, a cross resonance operation based on the coupling. A detuning between the first operating frequency and the second operating frequency is larger than the first anharmonicity and the second anharmonicity. An advantage of such a computer-implemented method is that it can be implemented to mitigate at least one of crosstalk or frequency collisions between at least one of the first qubit or the second qubit and an adjacent qubit.

In some embodiments, the above computer-implemented method can further comprise mitigating, by the system, static frequency collisions in a lattice of multiple qubits comprising neighboring qubits to the first qubit and the second qubit. The mitigating is based on a second detuning between two coupled qubits in the lattice being larger than anharmonicities of the two coupled qubits. An advantage of such a computer-implemented method is that it can be implemented to mitigate at least one of crosstalk or frequency collisions between at least one of the first qubit or the second qubit and one or more adjacent qubits.

According to another embodiment, a device can comprise a first qubit. The device can further comprise a second qubit that couples to the first qubit to perform a cross resonance operation in a dispersive regime of a qubit frequency space. An advantage of such a device is that it can mitigate at least one of crosstalk or frequency collisions between at least one of the first qubit or the second qubit and an adjacent qubit.

In some embodiments, the second qubit couples to the first qubit to perform the cross resonance operation in the dispersive regime of the qubit frequency space to facilitate mitigation of at least one of crosstalk or frequency collisions between at least one of the first qubit or the second qubit and an adjacent qubit. An advantage of such a device is that it can mitigate at least one of crosstalk or frequency collisions between at least one of the first qubit or the second qubit and the adjacent qubit.

According to another embodiment, a computer-implemented method can comprise coupling, by a system operatively coupled to a processor, a first qubit to a second qubit. The computer-implemented method can further comprise performing, by the system, a cross resonance operation in a dispersive regime of a qubit frequency space based on the coupling. An advantage of such a computer-implemented method is that it can be implemented to mitigate at least one of crosstalk or frequency collisions between at least one of the first qubit or the second qubit and an adjacent qubit.

In some embodiments, the above computer-implemented method can further comprise mitigating, by the system, at least one of crosstalk or frequency collisions between at least one of the first qubit or the second qubit and an adjacent qubit based on the coupling and the performing. An advantage of such a computer-implemented method is that it can be implemented to mitigate at least one of crosstalk or frequency collisions between at least one of the first qubit or the second qubit and the adjacent qubit.

According to another embodiment, a device can comprise a first set of qubits having first operating frequencies. The device can further comprise a second set of qubits having second operating frequencies. The device can further comprise a first qubit of the first set of qubits that couples to a second qubit of the second set of qubits to perform a cross resonance operation in a dispersive regime of a qubit frequency space. An advantage of such a device is that it can mitigate at least one of crosstalk or frequency collisions between at least one of the first qubit or the second qubit and one or more adjacent qubits.

In some embodiments, the second qubit couples to the first qubit to perform the cross resonance operation in the dispersive regime of the qubit frequency space to facilitate mitigation of at least one of crosstalk or frequency collisions between at least one of the first qubit or the second qubit and one or more adjacent qubits. An advantage of such a device is that it can mitigate at least one of crosstalk or frequency collisions between at least one of the first qubit or the second qubit and the one or more adjacent qubits.

DETAILED DESCRIPTION

Figure 1:
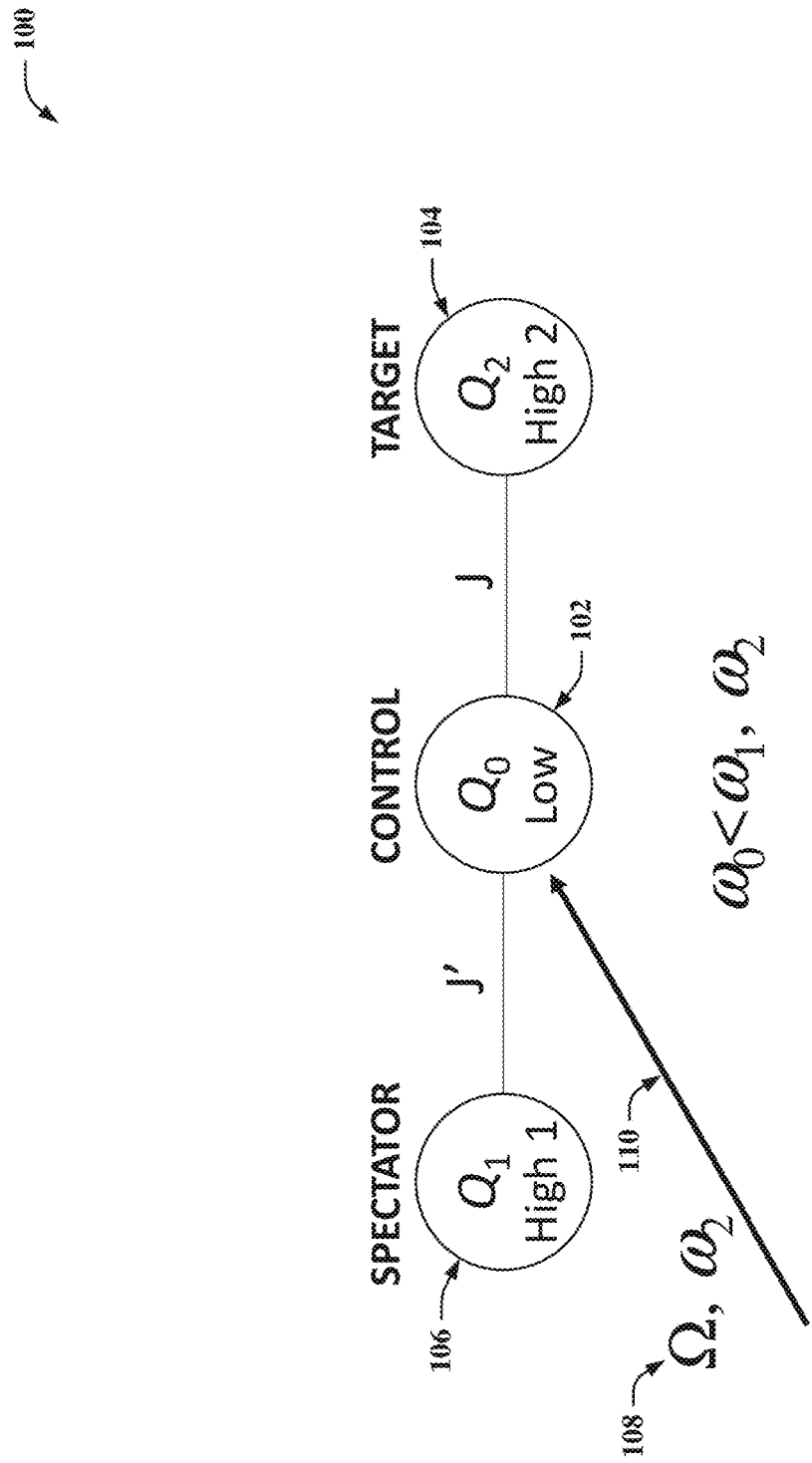
FIGS. 1 and 2 illustrate example, non-limiting devices that can facilitate a cross-resonance operation in a dispersive regime of a qubit frequency space in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Quantum computing is generally the use of quantum-mechanical phenomena for the purpose of performing computing and information processing functions. Quantum computing can be viewed in contrast to classical computing, which generally operates on binary values with transistors. That is, while classical computers can operate on bit values that are either 0 or 1, quantum computers operate on quantum bits (qubits) that comprise superpositions of both 0 and 1, can entangle multiple quantum bits, and use interference.

Given the problems described above with prior art technologies, the present disclosure can be implemented to produce a solution to these problems in the form of devices and/or computer-implemented methods that can facilitate performing a cross-resonance gate operation with the same or comparable speed, performance, fidelity, and/or ZZ coupling in the dispersive regime as can be achieved in the straddling regime by using a device comprising: a first qubit having a first operating frequency and a first anharmonicity; and/or a second qubit that couples to the first qubit to perform a cross-resonance operation, the second qubit having a second operating frequency and a second anharmonicity, where a detuning between the first operating frequency and the second operating frequency is larger than the first anharmonicity and the second anharmonicity. An advantage of such devices and/or computer-implemented methods is that they can be implemented to mitigate at least one of crosstalk or frequency collisions between at least one of the first qubit or the second qubit and one or more adjacent qubits.

In some embodiments, the present disclosure can be implemented to produce a solution to the problems described above in the form of devices and/or computer-implemented methods that can facilitate performing a cross-resonance gate operation with the same or comparable speed, performance, fidelity, and/or ZZ coupling in the dispersive regime as can be achieved in the straddling regime by using a device comprising: multiple qubits organized in a lattice, the multiple qubits including neighboring qubits to the first qubit and the second qubit, where based on a second detuning between two coupled qubits in the lattice being larger than anharmonicities of the two coupled qubits, static frequency collisions in the lattice are mitigated. An advantage of such devices and/or computer-implemented methods is that they can be implemented to mitigate at least one of crosstalk or frequency collisions between at least one of the first qubit or the second qubit and one or more adjacent qubits.

It will be understood that when an element is referred to as being "coupled" to another element, it can describe one or more different types of coupling including, but not limited to, chemical coupling, communicative coupling, electrical coupling, electromagnetic coupling, operative coupling, optical coupling, physical coupling, thermal coupling, and/or another type of coupling. It will also be understood that the following terms referenced herein are defined as follows:

Cross-resonance interaction: provides a microwave-only entangling two qubit gate for superconducting (fixed-frequency) qubits where a control qubit, denoted $Q_c$, is subjected to a pump tone that is off-resonant with $Q_c$ but is resonant with the frequency of the target qubit $Q_t$.

Entanglement: is created via rotations of the target qubit being conditional upon the state of the control qubit.

Straddling regime: is the regime of operation where the control-target detuning, $\Delta = \omega_c - \omega_t$, is positive and less than the qubit anharmonicity $\delta$ (i.e., $0 < \Delta = \omega_y - \omega_t < -\delta$. The control-target detuning is also referred to as qubit-qubit frequency detuning between control qubit $Q_c$ and target qubit $Q_t$.

Dispersive regime: of the qubits is where the detuning between the two qubits is much larger than either of their anharmonicities and the coupling between them is much smaller than the detuning.

Frequency collisions: refer to points in the qubit frequency space that are unusable for high fidelity operation of cross resonance gates.

As referenced herein, an entity can comprise a human, a client, a user, a computing device, a software application, an agent, a machine learning model, an artificial intelligence, and/or another entity. It should be appreciated that such an entity can facilitate the design, fabrication, and/or implementation (e.g., simulation, testing, etc.) of one or more embodiments of the subject disclosure described herein.

FIG. 1 illustrates an example, non-limiting device 100 that can facilitate a cross-resonance operation in a dispersive regime of a qubit frequency space in accordance with one or more embodiments described herein. Device 100 can comprise a semiconducting and/or a superconducting device that can be implemented in a quantum device. For example, device 100 can comprise an integrated semiconducting and/or superconducting circuit (e.g., a quantum circuit) that can be implemented in a quantum device such as, for instance, quantum hardware, a quantum processor, a quantum computer, and/or another quantum device. Device 100 can comprise a semiconducting and/or a superconducting device such as, for instance, a fixed-frequency quantum device that can be implemented in such a quantum device defined above. In some embodiments, device 100 can comprise a quantum processing device.

As illustrated in the example embodiment depicted in FIG. 1, device 100 can comprise a control qubit 102 (denoted as "Control" and "$Q_0$ Low" in FIG. 1), a target qubit 104 (denoted as "Target" and "$Q_2$ High 2" in FIG. 1), and/or a spectator qubit 106 (denoted as "Spectator" and "$Q_1$ High 1" in FIG. 1). In this example embodiment, control qubit 102 can be coupled to target qubit 104 and spectator qubit 106. For example, control qubit 102 can be capacitively coupled to target qubit 104 via a first bus resonator (not illustrated in FIG. 1), where such coupling is denoted as "J" in FIG. 1. In this example, control qubit 102 can also be capacitively coupled to spectator qubit 106 via a second bus resonator (not illustrated in FIG. 1), where such coupling is denoted as "J'" in FIG. 1.

Control qubit 102, target qubit 104, and/or spectator qubit 106 illustrated in the example embodiment depicted in FIG. 1 can each comprise, for instance, a transmon qubit, a fixed frequency qubit, a fixed frequency transmon qubit, a superconducting qubit, and/or another qubit. Control qubit 102 can have an operating frequency (e.g., resonant frequency) denoted as "$\omega_0$" in FIG. 1. Target qubit 104 can have an operating frequency (e.g., resonant frequency) denoted as "$\omega_2$" in FIG. 1. Spectator qubit 106 can have an operating frequency (e.g., resonant frequency) denoted as "$\omega_1$" in FIG. 1. In various embodiments, such operating frequencies $\omega_0$, $\omega_1$, and/or $\omega_2$ (e.g., resonant frequencies) of control qubit 102, spectator qubit 106, and/or target qubit 104, respectively, can be set during design and/or fabrication of device 100 (e.g., during design and/or fabrication of a Josephson junction in each of such qubits).

As illustrated in the example embodiment depicted in FIG. 1, control qubit 102 can have such an operating frequency $\omega_0$ that is lower than the operating frequency $\omega_2$ of target qubit 104 and lower than the operating frequency $\omega_1$ of spectator qubit 106, which is denoted as "$\omega_0 < \omega_1, \omega_2$" in FIG. 1. In this embodiment, the operating frequencies $\omega_0$, $\omega_1$, and/or $\omega_2$ of control qubit 102, spectator qubit 106, and/or target qubit 104, respectively, can comprise operating frequencies that are in a dispersive regime of a qubit frequency space (e.g., a dispersive regime of a qubit computational space comprising the $|0\rangle$ and/or $|1\rangle$ quantum states that can store quantum information). For brevity, such a "dispersive regime of a qubit frequency space" can be referred to herein as "dispersive regime."

Device 100 and/or control qubit 102 can be coupled to an external device (not illustrated in the figures). For example, device 100 and/or control qubit 102 can be coupled to an external device that can be external to device 100 such as, for instance, a pulse generator device and/or a microwave laser device. In an example embodiment, although not depicted in FIG. 1, device 100 and/or control qubit 102 can be coupled to a pulse generator device including, but not limited to, an arbitrary waveform generator (AWG), a vector network analyzer (VNA), and/or another pulse generator device that can be external to device 100 and can transmit and/or receive pulses (e.g., microwave pulses, microwave signals, control signals, etc.) to and/or from device 100 and/or control qubit 102. In another example embodiment, although not depicted in FIG. 1, device 100 and/or control qubit 102 can be coupled to a microwave laser device including, but not limited to, a maser, and/or another microwave laser device that can be external to device 100 and can transmit and/or receive a laser of microwave light to and/or from device 100 and/or control qubit 102.

In accordance with one or more embodiments of the subject disclosure, such an external device described above (e.g., an AWG, a VNA, a maser, etc.) can also be coupled to a computer comprising a memory that can store instructions thereon and a processor that can execute such instructions. For example, in these embodiments, such an external device described above (e.g., an AWG, a VNA, a maser, etc.) can also be coupled to a computer 1012 described below with reference to FIG. 10, where computer 1012 can comprise a system memory 1016 that can store instructions thereon (e.g., software, routines, processing threads, etc.) and a processing unit 1014 that can execute such instructions. In these embodiments, such a computer can be employed to operate and/or control (e.g., via processing unit 1014 executing instructions stored on system memory 1016) such an external device described above (e.g., an AWG, a VNA, a maser, etc.). For instance, in these embodiments, such a computer can be employed to enable the external device described above (e.g., an AWG, a VNA, a maser, etc.) to: a) transmit and/or receive pulses (e.g., microwave pulses, microwave signals, control signals, etc.) to and/or from device 100 and/or control qubit 102; and/or b) transmit and/or receive a laser of microwave light to and/or from device 100 and/or control qubit 102.

In the embodiments described above, such pulses and/or laser of microwave light can constitute a drive power 108 (denoted as "a" in FIG. 1). In the example embodiment illustrated in FIG. 1, drive power 108 is represented visually by an arrow 110. In this embodiment, drive power 108 can be applied (e.g., via an AWG, a VNA, a maser, computer 1012, etc.) to device 100 and/or control qubit 102 at the operating frequency $\omega_2$ of target qubit 104 (e.g., as denoted by "$\Omega, \omega_2$" in FIG. 1). In this embodiment, based on applying drive power 108 to device 100 and/or control qubit 102 as described above, control qubit 102 and target qubit 104 of device 100 can perform a cross-resonance operation in a dispersive regime of a qubit frequency space as described below (e.g., in a dispersive regime of a qubit computational space).

As defined above, the dispersive regime of a control qubit and a target qubit frequency space is where the detuning between the two qubits is much larger than either of their anharmonicities (e.g., expressed as $\Delta_{ct} \gg |\delta_c|, |\delta_t|$) and the coupling between them is much smaller than the detuning (e.g., expressed as $J_{ct} \ll \Delta_{ct}$). As referenced herein, "detuned" and/or "detuning" (denoted as "$\Delta$") is defined as the difference between the operating frequency $\omega_c$ of a control qubit and the operating frequency $\omega_t$ of a target qubit (e.g., expressed as $\Delta_{ct} = \omega_c - \omega_t$).

In the example embodiment illustrated in FIG. 1, detuning of control qubit 102 and target qubit 104 can be defined as the difference between the operating frequency $\omega_0$ of control qubit 102 and the operating frequency $\omega_2$ of target qubit 104 (e.g., expressed as $\Delta_{02} = \omega_0 - \omega_2$). In this embodiment, target qubit 104 and spectator qubit 106 can be far detuned from each other (e.g., $|\omega_2 - \omega_1| \gg 0$). In this embodiment, to facilitate a cross-resonance gate operation in the dispersive regime of a qubit frequency space of control qubit 102 and target qubit 104 (e.g., the qubit computational space of control qubit 102 and target qubit 104), an entity as defined herein can design, fabricate, and/or implement (e.g., simulate, test, etc.) device 100 such that: a) control qubit 102 and target qubit 104 are detuned to a value that is greater (e.g., much greater) than both an anharmonicity $\delta_0$ of control qubit 102 and an anharmonicity $\delta_2$ of target qubit 104 (e.g., expressed as $\Delta_{02} \gg |\delta_0|, |\delta_2|$); and b) the coupling J between control qubit 102 and target qubit 104 is smaller (e.g., much smaller) than the detuning (e.g., expressed as $J \ll \Delta_{02}$). For example, in this embodiment, to facilitate a cross-resonance gate operation in such a dispersive regime, such an entity can design, fabricate, and/or implement device 100 such that the condition $J \ll \Delta_{02} \gg |\delta_0|, |\delta_2|$ is satisfied. In an example embodiment, to enable performance of a cross resonance gate in a dispersive regime: the detuning $\Delta_{02} = 2$ gigahertz (GHz); $\delta_0 = \delta_2 = -0.3$ GHz; and J can be approximately equal to 10 megahertz (MHz) ($J \approx 10$ MHz).

In various embodiments, increasing the detuning $\Delta_{02}$ of control qubit 102 and target qubit 104 to a level that is larger (e.g., much larger) than the anharmonicities $\delta_0, \delta_2$ of both qubits can position the operating frequency $\omega_0$ of control qubit 102 and/or the operating frequency $\omega_2$ of target qubit 104 outside a straddling regime and into a dispersive regime of a frequency space of control qubit 102 and target qubit 104 when the coupling J between such qubits is smaller (e.g., much smaller) than the detuning $\Delta_{02}$ (e.g., expressed as $J \ll \Delta_{02} \gg |\delta_0|, |\delta_2|$). In these embodiments, when device 100 is designed, fabricated, and/or implemented such that the above defined condition $J \ll \Delta_{02} \gg |\delta_0|, |\delta_2|$ is satisfied, control qubit 102 and target qubit 104 can perform a cross-resonance gate operation in such a dispersive regime. In these embodiments, when device 100 is designed, fabricated, and/or implemented such that the above defined condition $J \ll \Delta_{02} \gg |\delta_0|, |\delta_2|$ is satisfied, control qubit 102 and target qubit 104 can perform a cross-resonance gate operation in such a dispersive regime with the exact same speed, performance, and/or ZZ coupling as a cross-resonance gate operation performed in the straddling regime.

In some embodiments, to facilitate a cross-resonance gate operation in the dispersive regime of a qubit frequency space of control qubit 102 and target qubit 104 (e.g., the qubit computational space of control qubit 102 and target qubit 104), an entity as defined herein can design, fabricate, and/or implement device 100 such that the ZX cross-resonance rate (also referred to herein as the dynamic entanglement rate) and the ZZ interaction rate (also referred to herein as the spurious static entanglement rate) corresponding to control qubit 102 and target qubit 104 are maintained (e.g., held constant) while detuning control qubit 102 and target qubit 104 far apart from one another. As referenced herein, the "ZX cross-resonance" describes entanglement (e.g., dynamic entanglement) of control qubit 102 and target qubit 104 and the "ZZ interaction" describes residual static ZZ interactions (e.g., spurious static entanglement) between control qubit 102 and target qubit 104. In the above described embodiments, maintaining (e.g., holding constant) the ZX cross-resonance rate and the ZZ interaction rate corresponding to control qubit 102 and target qubit 104 while detuning control qubit 102 and target qubit 104 far apart from one another can thereby eliminate or effectively eliminate frequency collisions (e.g., eliminate or effectively eliminate collision of immediate levels of control qubit 102 and target qubit 104).

It should be appreciated that a main challenge that is overcome by the subject disclosure in accordance with one or more of the embodiments described herein is how to maintain (e.g., hold constant) the ZX cross-resonance rate and the ZZ interaction rate at levels that enable control qubit 102 and target qubit 104 to perform a cross-resonance gate operation in such the dispersive regime. The ZX cross-resonance rate and the ZZ interaction rate are chiefly controlled by a single parameter of a two-qubit system comprising control qubit 102 and target qubit 104. This parameter, known as the cross energy-participation ratio (EPR), characterizes the amount of hybridization between control qubit 102 and target qubit 104. The more hybridized control qubit 102 and target qubit 104 are, the higher the ZX cross-resonance and ZZ interaction rates are. The cross energy-participation ratio reflects how much the target junction (e.g., the target Josephson junction) of target qubit 104 participates in the dressed control qubit mode of control qubit 102, while the anharmonicities $\delta_0, \delta_2$ and operating frequencies $\omega_0, \omega_2$ of control qubit 102 and target qubit 104, respectively, are essentially independent from the cross energy-participation ratio.

The ZZ interaction rate scales linearly with the cross energy-participation ratio, but the ZX cross-resonance rate scales like the square root of the cross energy-participation ratio. However, in the far detuned regime, for instance, in the dispersive regime, the cross energy-participation ratio can be kept constant for any detuning value as described below and/or in accordance with one or more embodiments of the subject disclosure. Therefore, in such a far detuned regime (e.g., the dispersive regime), an entity as defined herein that designs, fabricates, and/or implements device 100 such that it satisfies the above defined condition $J \ll \Delta_{02} \gg |\delta_0|, |\delta_2|$ can keep the cross energy-participation ratio constant for any detuning value as described below and/or in accordance with one or more embodiments of the subject disclosure.

From the view of the undressed qubits (e.g., undressed control qubit 102 and target qubit 104), the cross energy-participation ratio is a function of the coupling between such qubits over the detuning of the qubits (e.g., expressed as $J/\Delta$ in equation (1) defined below). Currently, the dispersive regime of a qubit frequency space is thought of as the "slow" gate regime, as surmised from the perturbative ZX cross-resonance rate expression defined below as equation (1) by keeping J fixed and varying $\Delta$.

$$\frac{ZX}{2} \text{linear} = -\frac{J\Omega}{\Delta}\left(\frac{\delta_1}{\delta_1 + \Delta}\right) \qquad \text{Equation (1)}$$

However, by keeping the cross energy-participation ratio fixed while varying delta arbitrarily, the equations defined below show that the ratio of the ZX cross-resonance rate and ZZ interaction rate (denoted as "ZX/ZZ") can be fixed independent of the detuning. The equations defined below also show that the same ZX cross-resonance and ZZ interaction rates that can be obtained in the straddling regime can also be obtained in the dispersive regime.

The approximate ZX cross-resonance rate in the dispersive regime can be defined as equation (2) below.

$$ZX = c_{ZX}\sqrt{p}\xi \qquad \text{Equation (2):}$$

The dimensionless cross-energy-participation ratio p is a single free parameter that sets the ZX cross-resonance rate. The constant of proportionality can be defined as equation (3) below.

$$c_{ZX} = \sqrt{\hbar^4 \omega_c \omega_t}/4E_J \qquad \text{Equation (3)}$$

where h denotes the reduced Planck's constant, quantum of electromagnetic action, $\omega_c$ denotes the dressed control qubit 102 frequency, $\omega_t$ denotes the dressed target qubit 104 frequency, and $E_J$ denotes the Josephson junction energy of control qubit 102.

The ZX cross-resonance rate is essentially independent of the detuning, that is, the frequencies of the qubits are irrelevant. For the same ZX cross-resonance rate, at larger detuning, a larger drive power is required. The dimensionless drive parameter can be defined as equation (4) below.

$$\xi = \frac{\Omega}{\Delta_{ct}} \qquad \text{Equation (4)}$$

The approximate ZZ interaction rate (also referred to as the ZZ cross-talk rate) in the dispersive regime can be defined as equation (5) below.

$$ZZ = c_{ZZ} p \qquad \text{Equation (5):}$$

The ZZ interaction rate (ZZ cross-talk rate) can be set by the same cross-participation ratio p described above. The constant of proportionality can be defined as equation (6) below.

$$c_{ZZ} = \hbar \frac{\omega_c \omega_t}{4E_J} \qquad \text{Equation (6)}$$

In some embodiments, to maintain (e.g., hold constant) the ZX cross-resonance rate and the ZZ interaction rate at levels that enable control qubit 102 and target qubit 104 to perform a cross-resonance gate operation in the dispersive regime, an entity as defined herein can design, fabricate, and/or implement device 100 such that the cross energy-participation ratio p is held constant while independently detuning control qubit 102 and target qubit 104 far apart (e.g., $\Delta_{02} \ll 0$) to reduce level collisions (e.g., while detuning control qubit 102 and target qubit 104 such that $0 \gg \Delta_{02} \gg |\delta_0|, |\delta_2|$). In these embodiments, such an entity can simultaneously maintain a fixed ZX/ZZ ratio (e.g., a fixed entanglement to spurious cross-talk ratio), for instance, as is currently done in the straddling regime, where the ZX/ZZ ratio is given by the inverse square-root of the cross energy-participation ratio p as defined in equation (7) below. In these embodiments, such an entity can maintain a fixed ZX/ZZ ratio by keeping the square-root of the cross energy-participation ratio p fixed.

$$\left|\xi \frac{ZZ}{ZX}\right| \approx \sqrt{p} \qquad \text{Equation (7)}$$

In the above described embodiments, to enable control qubit 102 and target qubit 104 to achieve maximum gate speed of a cross-resonance gate operation in the dispersive regime, such an entity that can design, fabricate and/or implement device 100 can adjust drive power 108 such that the value of the dimensionless drive parameter $\xi$ defined above in equation (4) is at or approximately at ½ (e.g., $\xi = \frac{1}{2}$ or $\xi \approx \frac{1}{2}$). In these embodiments, as described above, control qubit 102 can comprise an operating frequency $\omega_0$ that is lower than an operating frequency $\omega_2$ of target qubit 104 and far detuned (e.g., $\Delta_{02} \ll 0$). In these embodiments, the anharmonicities $\delta_0, \delta_2$ and operating frequencies $\omega_0, \omega_2$ of control qubit 102 and target qubit 104, respectively, can be set independently by such an entity that can design, fabricate, and/or implement device 100. In these embodiments, the cross energy-participation ratio p is a purely geometric quantity and can be set by such an entity by adjusting the coupler geometry of device 100 (e.g., by adjusting the effective capacitance between control qubit 102 and target qubit 104).

Figure 3:
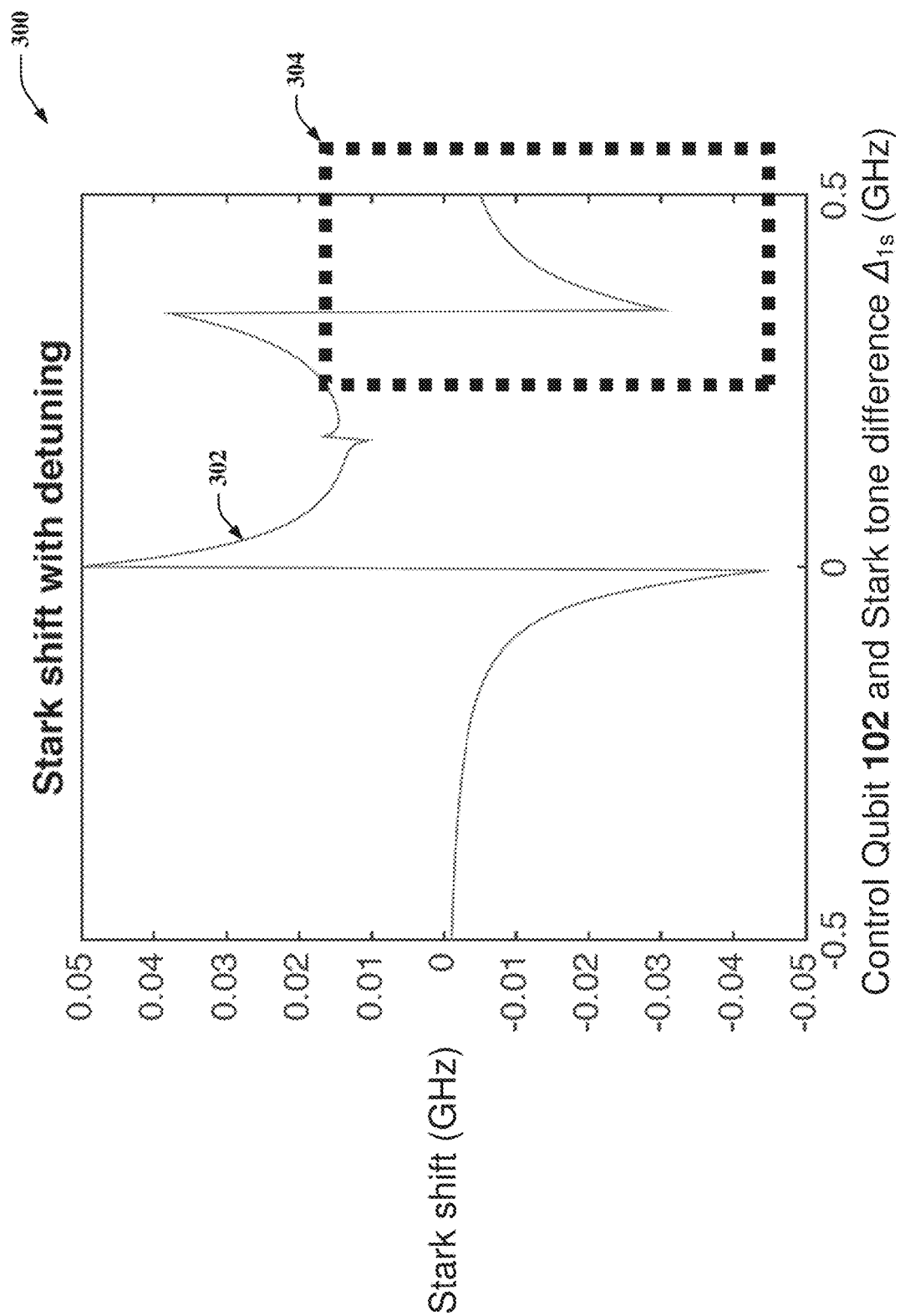
FIGS. 3 and 4 illustrate example, non-limiting graphs that can facilitate a cross-resonance operation in a dispersive regime of a qubit frequency space in accordance with one or more embodiments described herein.

In the example embodiment depicted in FIG. 1, based on applying drive power 108 to device 100 and/or control qubit 102 as described above (e.g., via an AWG, a VNA, a maser, computer 1012, etc.), the Stark shift on control qubit 102 arising from a cross resonance tone that is higher in frequency can move control qubit 102 further away from target qubit 104 and/or spectator qubit 106, or vice versa, thereby reducing dynamic collisions (e.g., frequency collisions). For example, region 304 of graph 300 described below and depicted in FIG. 3 illustrates the Stark shift on control qubit 102 that can arise over a range of off-resonant tones.

It should be appreciated that when device 100 is designed, fabricated, and/or implemented as described above, device 100 can facilitate mitigation of crosstalk and/or frequency collisions between at least one of control qubit 102 or target qubit 104 and an adjacent qubit (e.g., a neighboring qubit located at a position on device 100 that is adjacent to control qubit 102 and/or target qubit 104). For instance, when device 100 is designed, fabricated, and/or implemented as described above such that control qubit 102 and target qubit 104 can perform a cross-resonance gate operation in the dispersive regime, device 100 can facilitate mitigation of crosstalk and/or frequency collisions between at least one of control qubit 102 or target qubit 104 and spectator qubit 106.

Fabrication of device 100 can comprise multi-step sequences of, for example, photolithographic and/or chemical processing steps that facilitate gradual creation of electronic-based systems, devices, components, and/or circuits in a semiconducting and/or a superconducting device (e.g., an integrated circuit). For instance, device 100 can be fabricated on a substrate (e.g., a silicon (Si) substrate, etc.) by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, etc.), etching techniques (e.g., reactive ion etching (RIE), dry etching, wet etching, ion beam etching, plasma etching, laser ablation, etc.), evaporation techniques, sputtering techniques, plasma ashing techniques, thermal treatments (e.g., rapid thermal anneal, furnace anneals, thermal oxidation, etc.), chemical vapor deposition (CVD), atomic layer deposition (ALD), physical vapor deposition (PVD), molecular beam epitaxy (MBE), electrochemical deposition (ECD), chemical-mechanical planarization (CMP), backgrinding techniques, and/or another technique for fabricating an integrated circuit.

Device 100 can be fabricated using various materials. For example, device 100 can be fabricated using materials of one or more different material classes including, but not limited to: conductive materials, semiconducting materials, superconducting materials, dielectric materials, polymer materials, organic materials, inorganic materials, non-conductive materials, and/or another material that can be utilized with one or more of the techniques described above for fabricating an integrated circuit.

Figure 2:
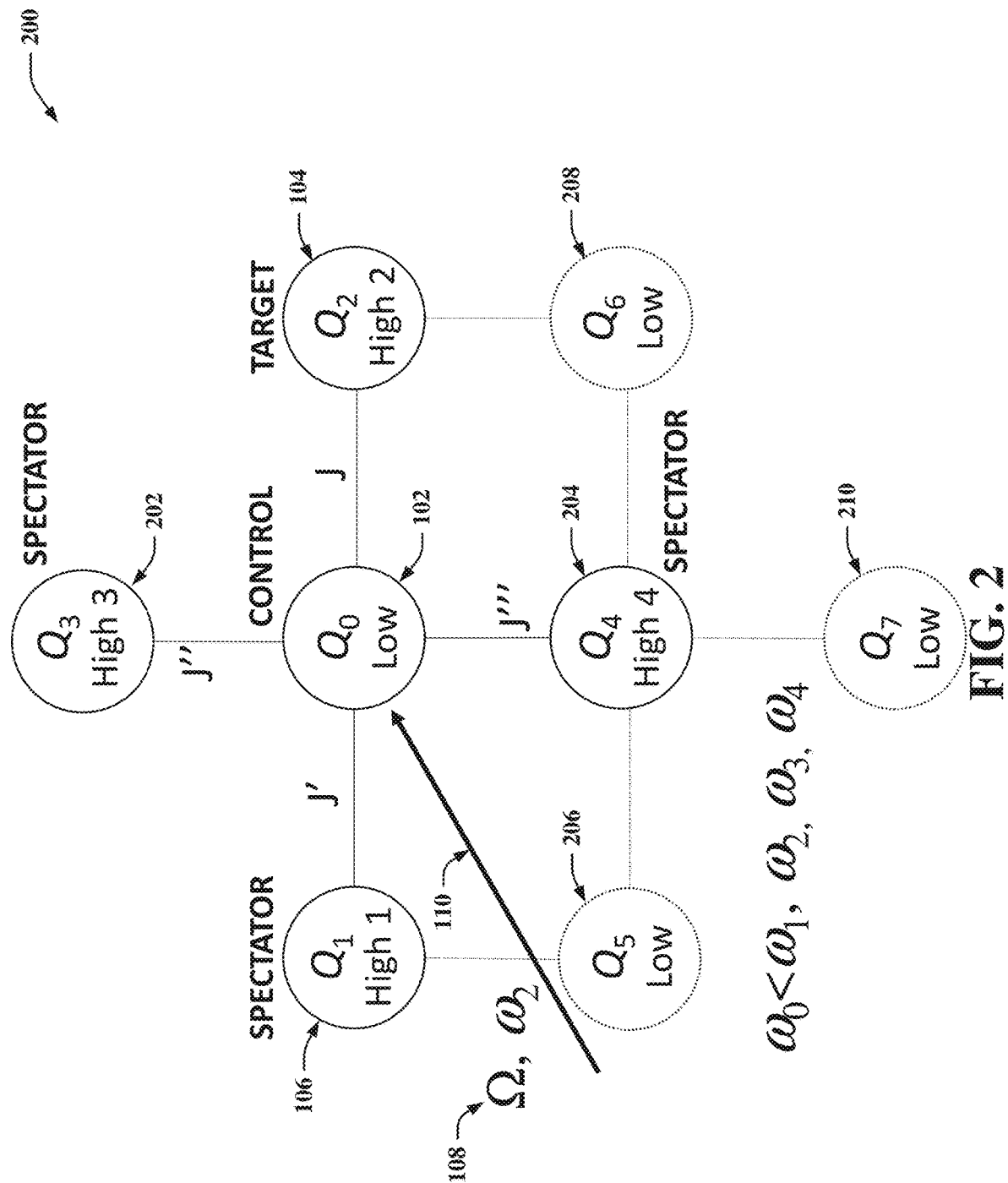

FIG. 2 illustrates an example, non-limiting device 200 that can facilitate a cross-resonance operation in a dispersive regime of a qubit frequency space in accordance with one or more embodiments described herein. Repetitive description of like elements and/or processes employed in respective embodiments is omitted for sake of brevity.

Device 200 can comprise an example, non-limiting alternative embodiment of device 100 described above with reference to FIG. 1. In the example embodiment illustrated in FIG. 2, device 200 can comprise a plurality of qubits organized in a lattice architecture. Device 200 can comprise a semiconducting and/or a superconducting device that can be implemented in a quantum device. For example, device 200 can comprise an integrated semiconducting and/or superconducting circuit (e.g., a quantum circuit) that can be implemented in a quantum device such as, for instance, quantum hardware, a quantum processor, a quantum computer, and/or another quantum device. Device 200 can comprise a semiconducting and/or a superconducting device such as, for instance, a fixed-frequency quantum device that can be implemented in such a quantum device defined above. In some embodiments, device 200 can comprise a quantum processing device.

As illustrated in the example embodiment depicted in FIG. 2, device 200 can comprise control qubit 102, target qubit 104, and spectator qubit 106 of device 100. In the example embodiment depicted in FIG. 2, device 200 can further comprise: a spectator qubit 202 (denoted as "Spectator" and "$Q_3$ High 3" in FIG. 2); a spectator qubit 204 (denoted as "Spectator" and "$Q_4$ High 4" in FIG. 2); a qubit 206 (denoted as "$Q_5$ Low" in FIG. 2); a qubit 208 (denoted as "$Q_6$ Low" in FIG. 2); and/or a qubit 210 (denoted as "$Q_7$ Low" in FIG. 2). In this example embodiment, control qubit 102, qubit 206, qubit 208, and/or qubit 210 of device 200 can constitute a first set of qubits having first operating frequencies (e.g., low frequencies relative to target qubit 104, spectator qubit 106, spectator qubit 202, and/or spectator qubit 204 of device 200). In this example embodiment, target qubit 104, spectator qubit 106, spectator qubit 202, and/or spectator qubit 204 of device 200 can constitute a second set of qubits having second operating frequencies (e.g., high frequencies relative to control qubit 102, qubit 206, qubit 208, and/or qubit 210).

In the example embodiment illustrated in FIG. 2, control qubit 102 can be coupled to target qubit 104, spectator qubit 106, spectator qubit 202, and/or spectator qubit 204. For example, control qubit 102 can be capacitively coupled to target qubit 104 via a first bus resonator (not illustrated in FIG. 2), where such coupling is denoted as "J" in FIG. 2. In this example, control qubit 102 can also be capacitively coupled to spectator qubit 106 via a second bus resonator (not illustrated in FIG. 2), where such coupling is denoted as "J'" in FIG. 2. In this example, control qubit 102 can be further coupled to: spectator qubit 202 via a third bus resonator (not illustrated in FIG. 2), where such coupling is denoted as "J''" in FIG. 2; and/or spectator qubit 204 via a fourth bus resonator (not illustrated in FIG. 2), where such coupling is denoted as "J'''" in FIG. 2.

As illustrated in the example embodiment depicted in FIG. 2, qubit 206 can be coupled to spectator qubit 106 and/or spectator qubit 204 via, for instance, one or more bus resonators (not illustrated in FIG. 2). In this example embodiment, qubit 208 can be coupled to target qubit 104 and/or spectator qubit 204 via, for instance, one or more bus resonators (not illustrated in FIG. 2). In this example embodiment, qubit 210 can be coupled to spectator qubit 204 via, for instance, a bus resonator (not illustrated in FIG. 2).

Spectator qubit 202, spectator qubit 204, qubit 206, qubit 208, and/or qubit 210 illustrated in the example embodiment depicted in FIG. 2 can each comprise, for instance, a transmon qubit, a fixed frequency qubit, a fixed frequency transmon qubit, a superconducting qubit, and/or another qubit. As described above with reference to FIG. 1, control qubit 102, target qubit 104, and spectator qubit 106 can respectively have operating frequencies $\omega_0$, $\omega_2$, $\omega_1$ that can be set during design and/or fabrication of device 200 (e.g., during design and/or fabrication of a Josephson junction in each of such qubits). Spectator qubit 202 of device 200 can have an operating frequency (e.g., resonant frequency) denoted as "$\omega_3$" in FIG. 2. Spectator qubit 204 of device 200 can have an operating frequency (e.g., resonant frequency) denoted as "$\omega_4$" in FIG. 2. In various embodiments, such operating frequencies $\omega_3$ and/or $\omega_4$ (e.g., resonant frequencies) of spectator qubit 202 and/or spectator qubit 204, respectively, can be set during design and/or fabrication of device 200 (e.g., during design and/or fabrication of a Josephson junction in each of such qubits).

As illustrated in the example embodiment depicted in FIG. 2, control qubit 102 can have such an operating frequency $\omega_0$ that is lower than the operating frequencies $\omega_1$, $\omega_2$, $\omega_3$, and $\omega_4$ of spectator qubit 106, target qubit 104, spectator qubit 202, and spectator qubit 204, respectively, which is denoted as "$\omega_0 < \omega_1, \omega_2, \omega_3, \omega_4$" in FIG. 2. In this embodiment, the operating frequencies $\omega_0$, $\omega_1$, $\omega_2$, $\omega_3$, and/or $\omega_4$ of control qubit 102, spectator qubit 106, target qubit 104, spectator qubit 202, and/or spectator qubit 204, respectively, can comprise operating frequencies that are in a dispersive regime of a qubit frequency space (e.g., a dispersive regime of a qubit computational space). In this embodiment, target qubit 104, spectator qubit 106, spectator qubit 202, and/or spectator qubit 204 can be far detuned from each other (e.g., $|\omega_2 - \omega_1| \gg 0$, $|\omega_4 - \omega_3| \gg 0$, etc.).

In the example embodiment illustrated in FIG. 2, device 200 and/or control qubit 102 can be further coupled to one or more external devices (e.g., an AWG, a VNA, a maser, computer 1012, etc.) that can provide drive power 108 (e.g., as described above with reference FIG. 1). In this example embodiment, drive power 108 can be applied (e.g., via an AWG, a VNA, a maser, computer 1012, etc.) to device 200 and/or control qubit 102 at the operating frequency $\omega_2$ of target qubit 104 (e.g., as denoted by "$\Omega, \omega_2$" in FIG. 2), where such application of drive power 108 is represented visually by arrow 110 in FIG. 2. In this example embodiment, based on applying drive power 108 to device 200 and/or control qubit 102 as described above, control qubit 102 and target qubit 104 of device 200 can perform a cross-resonance operation in a dispersive regime of a qubit frequency space (e.g., in a dispersive regime of a qubit computational space). For example, with reference to FIG.

1, control qubit 102 and target qubit 104 of device 200 can perform a cross-resonance gate operation in the dispersive regime in the same manner as control qubit 102 and target qubit 104 of device 100 can perform a cross-resonance gate operation in the dispersive regime.

In the example embodiment depicted in FIG. 2, based on applying drive power 108 to device 200 and/or control qubit 102 as described above (e.g., via an AWG, a VNA, a maser, computer 1012, etc.), the Stark shift on control qubit 102 arising from a cross resonance tone that is higher in frequency can move control qubit 102 further away from target qubit 104, spectator qubit 106, spectator qubit 202, and/or spectator qubit 204, or vice versa, thereby reducing dynamic collisions (e.g., frequency collisions). For example, region 304 of graph 300 described below and depicted in FIG. 3 illustrates the Stark shift on control qubit 102 that can arise over a range of off-resonant tones.

It should be appreciated that when device 200 is designed, fabricated, and/or implemented as described above, device 200 can facilitate mitigation of crosstalk and/or frequency collisions between at least one of control qubit 102 or target qubit 104 and one or more adjacent qubits (e.g., one or more neighboring qubits located at positions on device 200 that are adjacent to control qubit 102 and/or target qubit 104). For instance, when device 200 is designed, fabricated, and/or implemented as described above such that control qubit 102 and target qubit 104 can perform a cross-resonance gate operation in the dispersive regime, device 200 can facilitate mitigation of crosstalk and/or frequency collisions between at least one of control qubit 102 or target qubit 104 and spectator qubit 106, spectator qubit 202, spectator qubit 204, qubit 206, qubit 208, and/or qubit 210 of device 200.

Fabrication of device 200 can comprise multi-step sequences of, for example, photolithographic and/or chemical processing steps that facilitate gradual creation of electronic-based systems, devices, components, and/or circuits in a semiconducting and/or a superconducting device (e.g., an integrated circuit). For instance, device 200 can be fabricated on a substrate (e.g., a silicon (Si) substrate, etc.) by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, etc.), etching techniques (e.g., reactive ion etching (RIE), dry etching, wet etching, ion beam etching, plasma etching, laser ablation, etc.), evaporation techniques, sputtering techniques, plasma ashing techniques, thermal treatments (e.g., rapid thermal anneal, furnace anneals, thermal oxidation, etc.), chemical vapor deposition (CVD), atomic layer deposition (ALD), physical vapor deposition (PVD), molecular beam epitaxy (MBE), electrochemical deposition (ECD), chemical-mechanical planarization (CMP), backgrinding techniques, and/or another technique for fabricating an integrated circuit.

Device 200 can be fabricated using various materials. For example, device 200 can be fabricated using materials of one or more different material classes including, but not limited to: conductive materials, semiconducting materials, superconducting materials, dielectric materials, polymer materials, organic materials, inorganic materials, non-conductive materials, and/or another material that can be utilized with one or more of the techniques described above for fabricating an integrated circuit.

FIG. 3 illustrates an example, non-limiting graph 300 that can facilitate a cross-resonance operation in a dispersive regime of a qubit frequency space in accordance with one or more embodiments described herein. Repetitive description of like elements and/or processes employed in respective embodiments is omitted for sake of brevity.

Graph 300 can comprise results data yielded from implementing one or more embodiments of the subject disclosure described herein. For example, graph 300 can comprise results data yielded from designing, fabricating, and/or implementing (e.g., simulating, quantizing, testing, etc.) device 100 and/or device 200 as described above with reference to FIGS. 1 and 2 and/or in accordance with one or more other embodiments of the subject disclosure described herein (e.g., in accordance with computer-implemented methods 500, 600, 700, 800, and/or 900 described below with reference to FIGS. 5, 6, 7, 8, and 9, respectively).

In the example, non-limiting graph 300 depicted in FIG. 3, such results data described above can be rendered on graph 300 as plot 302 that illustrates the Stark shift on control qubit 102 that can arise with detuning. For example, plot 302 illustrates the Stark shift on control qubit 102 that can arise over a range of off-resonant tones. In the example, non-limiting graph 300 depicted in FIG. 3, the Y-axis of graph 300 illustrates the Stark shift (expressed in gigahertz (GHz)) on control qubit 102 that can arise over a range of off-resonant tones that are illustrated in the X-axis of graph 300 and denoted as "Control Qubit 102 and Stark tone difference $\Delta_{1s}$ (GHz)" in FIG. 3. Region 304 represented visually by the dashed rectangle in FIG. 3 shows the direction of the Stark shift on control qubit 102 over a range of off-resonant tones, where such a Stark shift on control qubit 102 in region 304 can reduce dynamic collisions (e.g., frequency collisions).

Figure 4:
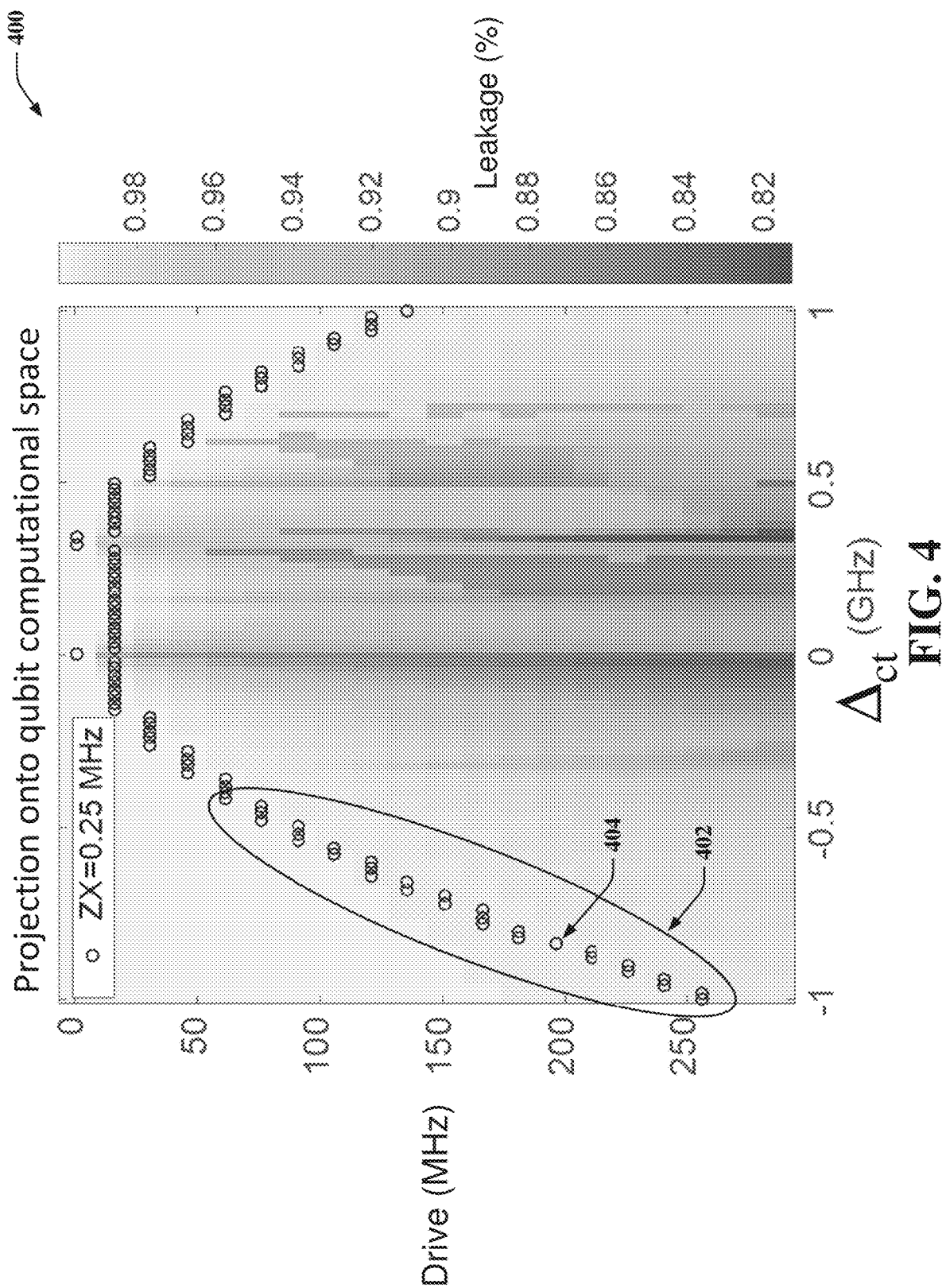

FIG. 4 illustrates an example, non-limiting graph 400 that can facilitate a cross-resonance operation in a dispersive regime of a qubit frequency space in accordance with one or more embodiments described herein. Repetitive description of like elements and/or processes employed in respective embodiments is omitted for sake of brevity.

Graph 400 can comprise results data yielded from implementing one or more embodiments of the subject disclosure described herein. For example, graph 400 can comprise results data yielded from designing, fabricating, and/or implementing (e.g., simulating, quantizing, testing, etc.) device 100 and/or device 200 as described above with reference to FIGS. 1 and 2 and/or in accordance with one or more other embodiments of the subject disclosure described herein (e.g., in accordance with computer-implemented methods 500, 600, 700, 800, and/or 900 described below with reference to FIGS. 5, 6, 7, 8, and 9, respectively).

Graph 400 can comprise an illustration of leakage out of the qubit computational space as it relates to device 100 and/or device 200 described above with reference to FIGS. 1 and 2. As referenced herein, "leakage" describes the percentage (%) of quantum information stored in the $|0\rangle$ and/or $|1\rangle$ quantum states (e.g., the qubit computational space) that leaks out of such quantum states and into one or more other quantum states (e.g., the $|2\rangle$ quantum state, the $|3\rangle$ quantum state, etc.).

As illustrated in FIG. 4, graph 400 illustrates such leakage described above as a function of drive power expressed in megahertz (MHz) in the Y-axis of graph 400 and detuning of a control qubit and a target qubit (denoted as $\Delta_{ct}$ in FIG. 4) expressed in gigahertz (GHz) in the X-axis of graph 400. In some embodiments, graph 400 illustrates such leakage described above as a function of drive power 108 expressed in MHz in the Y-axis of graph 400 and detuning of control qubit 102 and target qubit 104 expressed in GHz in the X-axis of graph 400. Graph 400 further illustrates such leakage as a percentage (%) represented by varying shades of gray in the Z-axis of graph 400 (e.g., the axis of graph 400 extending into and out of the page).

Region 402 of graph 400 illustrates markers 404 that represent detuning and drive power parameters that can be used to perform a cross-resonance gate operation with a fixed ZX cross-resonance rate (only a single marker 404 is annotated in FIG. 4 for clarity). For example, with reference to the above descriptions of the example embodiments depicted in FIGS. 1 and 2, an entity as defined herein can use one or more of the detuning and/or drive power parameters represented by markers 404 of graph 400 to design, fabricate, and/or implement device 100 and/or device 200 such that control qubit 102 and target qubit 104 can perform a cross-resonance gate operation with a fixed ZX cross-resonance rate (e.g., 0.25 MHz as denoted in FIG. 4). For instance, with reference to the above descriptions of the example embodiments depicted in FIGS. 1 and 2, an entity as defined herein can use one or more of the detuning and/or drive power parameters represented by markers 404 of graph 400 to design, fabricate, and/or implement device 100 and/or device 200 such that control qubit 102 and target qubit 104 can perform a cross-resonance gate operation in the dispersive regime based on a fixed ZX cross-resonance rate of 0.25 MHz as denoted in FIG. 4.

Device 100 and/or device 200 can be associated with various technologies. For example, device 100 and/or device 200 can be associated with quantum computing technologies, quantum gate technologies, quantum cross-resonance gate operation technologies, quantum coupler technologies, quantum hardware and/or software technologies, quantum circuit technologies, superconducting circuit technologies, machine learning technologies, artificial intelligence technologies, cloud computing technologies, and/or other technologies.

Device 100 and/or device 200 can provide technical improvements to systems, devices, components, operational steps, and/or processing steps associated with the various technologies identified above. For example, device 100 and/or device 200 can mitigate crosstalk (e.g., ZZ interactions) and/or frequency collisions between at least one of control qubit 102 or target qubit 104 and one or more adjacent qubits such as, for instance, spectator qubit 106, spectator qubit 202, spectator qubit 204, qubit 206, qubit 208, qubit 210, and/or another qubit of device 100 and/or device 200. In this example, such mitigation of crosstalk and/or frequency collisions between such qubits can thereby facilitate at least one of: reduced dynamic spectator errors (e.g., associated with spectator qubit 106, spectator qubit 202, spectator qubit 204, etc.); reduced leakage errors; and/or reduced quantum gate errors associated with control qubit 102 and/or target qubit 104.

In another example, contrary to the previously commonly-held view, device 100 and/or device 200 can perform a cross-resonance gate operation with the same or comparable speed (e.g., cross-resonance gate time), performance (e.g., accuracy), fidelity, and/or ZZ coupling (e.g., ZZ interaction rate) in the dispersive regime as can be achieved in the straddling regime. This is not only beneficial to reduce leakage errors but also largely eliminates the frequency crowding problem, and thus paves a path forward to higher performance and a scalable cross-resonance architecture. Device 100 and/or device 200 provide a solution to the very challenging frequency crowding problem with no major hardware change and zero new overhead, which is especially important as quantum processors scale. Device 100 and/or device 200 further allow for larger tolerances in design and/or fabrication of such devices, as well as flexibility for different qubit anharmonicities (e.g., smaller target qubit anharmonicity means a large qubit detuning limit is more easily achieved).

Device 100 and/or device 200 can provide technical improvements to a processing unit (e.g., a quantum processor comprising device 100 and/or device 200) that can be associated with device 100 and/or device 200. For example, as described above, by mitigating crosstalk (e.g., ZZ interactions) and/or frequency collisions between multiple qubits as described above, device 100 and/or device 200 can thereby facilitate: reduced quantum gate errors associated with a two-qubit system comprising control qubit 102 and/or target qubit 104 that performs a cross-resonance gate operation in the dispersive regime; increased quantum gate speed associated with such a two-qubit system; improved fidelity associated with such a two-qubit system; and/or improved performance associated with such a two-qubit system. In this example, by reducing such quantum gate errors, increasing the quantum gate speed, improving fidelity, and/or improving performance of such a two-qubit system that performs a cross-resonance gate operation in the dispersive regime, device 100 and/or device 200 can facilitate improved accuracy, speed, fidelity, and/or performance of a quantum processor comprising device 100 and/or device 200.

Based on such mitigation of crosstalk (e.g., ZZ interactions) and/or frequency collisions between multiple qubits as described above, a practical application of device 100 and/or device 200 is that they can be implemented in a quantum device (e.g., a quantum processor, a quantum computer, etc.) to more quickly and more efficiently compute, with improved fidelity and/or accuracy, one or more solutions (e.g., heuristic(s), etc.) to a variety of problems ranging in complexity (e.g., an estimation problem, an optimization problem, etc.) in a variety of domains (e.g., finance, chemistry, medicine, etc.). For example, based on such mitigation of crosstalk (e.g., ZZ interactions) and/or frequency collisions between multiple qubits as described above, a practical application of device 100 and/or device 200 is that they can be implemented in, for instance, a quantum processor to compute, with improved fidelity and/or accuracy, one or more solutions (e.g., heuristic(s), etc.) to an optimization problem in the domain of chemistry, medicine, and/or finance, where such a solution can be used to engineer, for instance, a new chemical compound, a new medication, and/or a new options pricing system and/or method.

It should be appreciated that device 100 and/or device 200 provide a new approach driven by relatively new quantum computing technologies. For example, device 100 and/or device 200 provide a new approach to mitigate crosstalk (e.g., ZZ interactions) and/or frequency collisions between multiple qubits as described above that result in quantum gate errors during quantum computations. In this example, such a new approach to mitigate such crosstalk (e.g., ZZ interactions) and/or frequency collisions can enable faster and more efficient quantum computations with improved fidelity and/or accuracy using a quantum processor comprising device 100 and/or device 200.

Device 100 and/or device 200 can employ hardware and/or software to solve problems that are highly technical in nature, that are not abstract and that cannot be performed as a set of mental acts by a human. In some embodiments, one or more of the processes described herein can be performed by one or more specialized computers (e.g., a specialized processing unit, a specialized classical computer, a specialized quantum computer, etc.) to execute defined tasks related to the various technologies identified above. Device 100 and/or device 200 can be employed to solve new problems that arise through advancements in technologies mentioned above, employment of quantum computing systems, cloud computing systems, computer architecture, and/or another technology.

It is to be appreciated that device 100 and/or device 200 can utilize various combinations of electrical components, mechanical components, and circuitry that cannot be replicated in the mind of a human or performed by a human, as the various operations that can be executed by device 100 and/or device 200 are operations that are greater than the capability of a human mind. For instance, the amount of data processed, the speed of processing such data, or the types of data processed by device 100 and/or device 200 over a certain period of time can be greater, faster, or different than the amount, speed, or data type that can be processed by a human mind over the same period of time.

According to several embodiments, device 100 and/or device 200 can also be fully operational towards performing one or more other functions (e.g., fully powered on, fully executed, etc.) while also performing the various operations described herein. It should be appreciated that such simultaneous multi-operational execution is beyond the capability of a human mind. It should also be appreciated that device 100 and/or device 200 can include information that is impossible to obtain manually by an entity, such as a human user. For example, the type, amount, and/or variety of information included in device 100 and/or device 200 can be more complex than information obtained manually by a human user.

Figure 5:
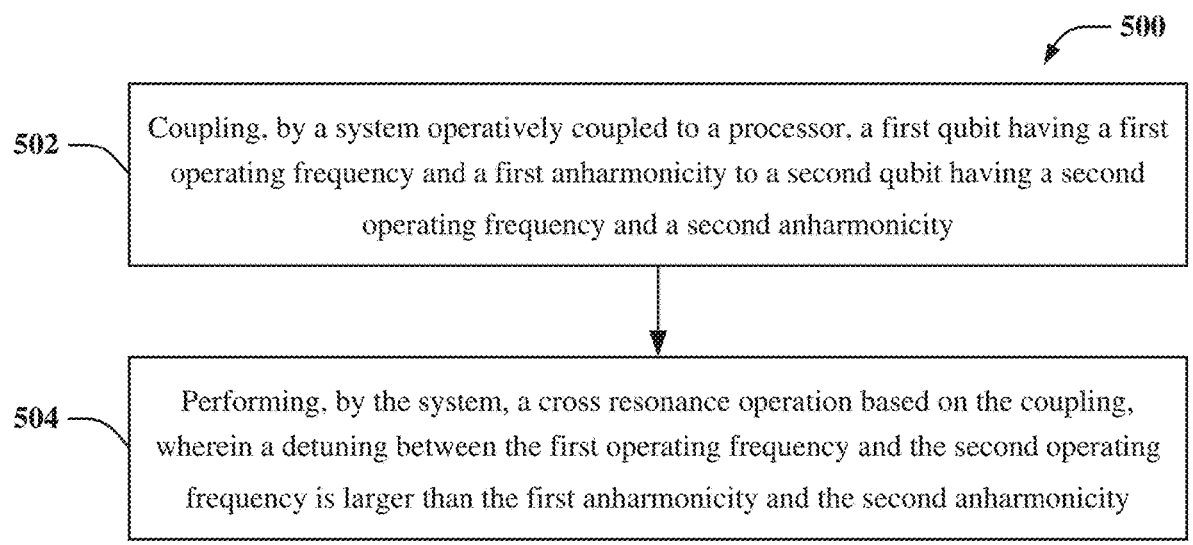
FIGS. 5, 6, 7, 8, and 9 illustrate flow diagrams of example, non-limiting computer-implemented methods that can facilitate a cross-resonance operation in a dispersive regime of a qubit frequency space in accordance with one or more embodiments described herein.

FIG. 5 illustrates a flow diagram of an example, non-limiting computer-implemented method 500 that can facilitate a cross-resonance operation in a dispersive regime of a qubit frequency space in accordance with one or more embodiments described herein. Repetitive description of like elements and/or processes employed in respective embodiments is omitted for sake of brevity.

At 502, computer-implemented method 500 can comprise coupling, by a system (e.g., a system comprising device 100 coupled to an AWG, a VNA, and/or a maser that can be coupled to computer 1012) operatively coupled to a processor (e.g., processing unit 1014, etc.), a first qubit having a first operating frequency and a first anharmonicity (e.g., control qubit 102 having operating frequency $\omega_0$ and anharmonicity $\delta_0$) to a second qubit having a second operating frequency and a second anharmonicity (e.g., target qubit 104 having operating frequency $\omega_2$ and anharmonicity $\delta_2$).

At 504, computer-implemented method 500 can comprise performing, by the system (e.g., a system comprising device 100 coupled to an AWG, a VNA, and/or a maser that can be coupled to computer 1012), a cross resonance operation (e.g., a cross-resonance gate operation) based on the coupling (e.g., based on the cross energy-participation ratio p described above with reference to FIG. 1), where a detuning (e.g., detuning $\Delta_{02}$) between the first operating frequency and the second operating frequency is larger than the first anharmonicity and the second anharmonicity (e.g., expressed as $\Delta_{02} \gg |\delta_0|, |\delta_2|$).

Figure 6:
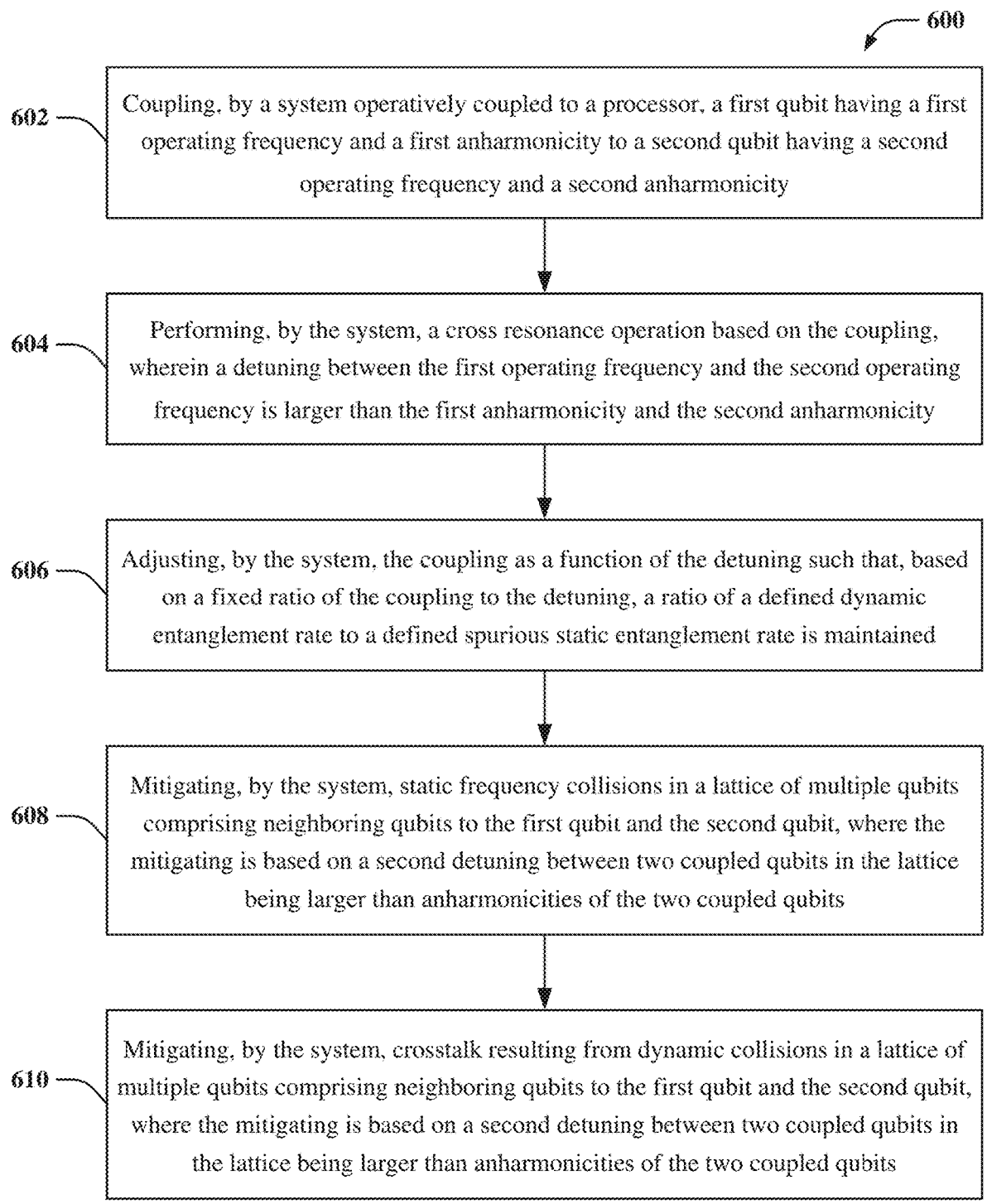

FIG. 6 illustrates a flow diagram of an example, non-limiting computer-implemented method 600 that can facilitate a cross-resonance operation in a dispersive regime of a qubit frequency space in accordance with one or more embodiments described herein. Repetitive description of like elements and/or processes employed in respective embodiments is omitted for sake of brevity.

At 602, computer-implemented method 600 can comprise coupling, by a system (e.g., a system comprising device 100 coupled to an AWG, a VNA, and/or a maser that can be coupled to computer 1012) operatively coupled to a processor (e.g., processing unit 1014, etc.), a first qubit having a first operating frequency and a first anharmonicity (e.g., control qubit 102 having operating frequency $\omega_0$ and anharmonicity $\delta_0$) to a second qubit having a second operating frequency and a second anharmonicity (e.g., target qubit 104 having operating frequency $\omega_2$ and anharmonicity $\delta_2$).

At 604, computer-implemented method 600 can comprise performing, by the system (e.g., a system comprising device 100 coupled to an AWG, a VNA, and/or a maser that can be coupled to computer 1012), a cross resonance operation (e.g., a cross-resonance gate operation) based on the coupling (e.g., based on the cross energy-participation ratio p described above with reference to FIG. 1), where a detuning (e.g., detuning $\Delta_{02}$) between the first operating frequency and the second operating frequency is larger than the first anharmonicity and the second anharmonicity (e.g., expressed as $\Delta_{02} \gg |\delta_0|, |\delta_2|$).

At 606, computer-implemented method 600 can comprise adjusting, by the system (e.g., a system comprising device 100 coupled to an AWG, a VNA, and/or a maser that can be coupled to computer 1012), the coupling (e.g., adjusting the cross energy-participation ratio p) as a function of the detuning such that, based on a fixed ratio of the coupling to the detuning (e.g., based on a fixed ratio of J/Δ), a ratio of a defined dynamic entanglement rate (e.g., a defined ZX cross-resonance rate) to a defined spurious static entanglement rate (e.g., a defined ZZ interaction rate) is maintained.

At 608, computer-implemented method 600 can comprise mitigating, by the system (e.g., a system comprising device 100 and/or device 200 coupled to an AWG, a VNA, and/or a maser that can be coupled to computer 1012), static frequency collisions in a lattice of multiple qubits (e.g., spectator qubit 106, spectator qubit 202, spectator qubit 204, qubit 206, qubit 208, and/or qubit 210 of device 200) comprising neighboring qubits to the first qubit and the second qubit, where the mitigating is based on a second detuning between two coupled qubits in the lattice (e.g., a detuning between spectator qubit 106 and qubit 206) being larger than anharmonicities of the two coupled qubits.

At 610, computer-implemented method 600 can comprise mitigating, by the system (e.g., a system comprising device 100 and/or device 200 coupled to an AWG, a VNA, and/or a maser that can be coupled to computer 1012), crosstalk resulting from dynamic collisions in a lattice of multiple qubits (e.g., spectator qubit 106, spectator qubit 202, spectator qubit 204, qubit 206, qubit 208, and/or qubit 210 of device 200) comprising neighboring qubits to the first qubit and the second qubit, where the mitigating is based on a second detuning between two coupled qubits in the lattice (e.g., a detuning between spectator qubit 106 and qubit 206) being larger than anharmonicities of the two coupled qubits.

Figure 7:
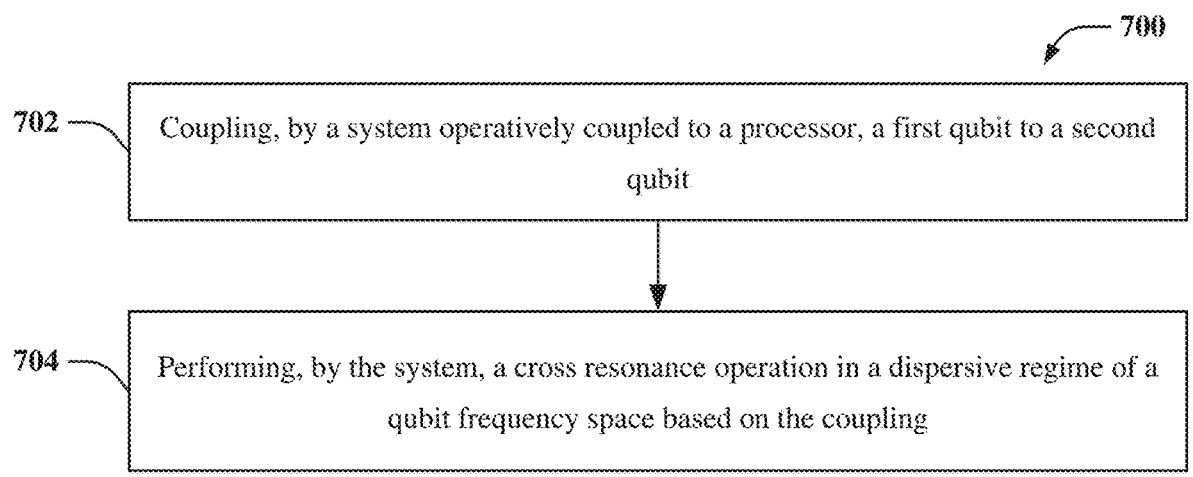

FIG. 7 illustrates a flow diagram of an example, non-limiting computer-implemented method 700 that can facilitate a cross-resonance operation in a dispersive regime of a qubit frequency space in accordance with one or more embodiments described herein. Repetitive description of like elements and/or processes employed in respective embodiments is omitted for sake of brevity.

At 702, computer-implemented method 700 can comprise coupling, by a system (e.g., a system comprising device 100 coupled to an AWG, a VNA, and/or a maser that can be coupled to computer 1012) operatively coupled to a processor (e.g., processing unit 1014, etc.), a first qubit (e.g., control qubit 102) to a second qubit (e.g., target qubit 104).

At 704, computer-implemented method 700 can comprise performing, by the system (e.g., a system comprising device 100 coupled to an AWG, a VNA, and/or a maser that can be coupled to computer 1012), a cross resonance operation (e.g., a cross-resonance gate operation) in a dispersive regime of a qubit frequency space based on the coupling (e.g., as described above with reference to FIG. 1).

Figure 8:
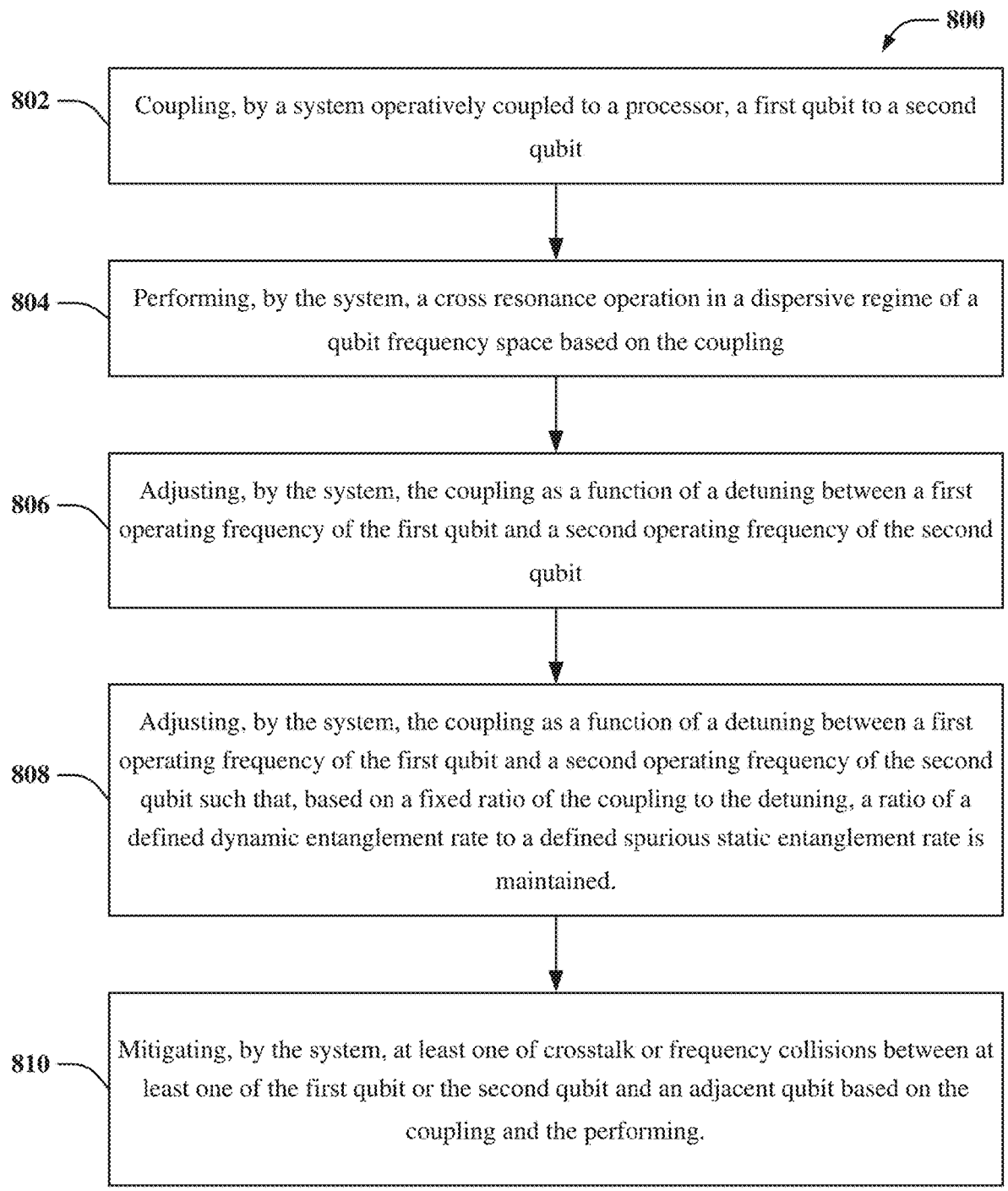

FIG. 8 illustrates a flow diagram of an example, non-limiting computer-implemented method 800 that can facilitate a cross-resonance operation in a dispersive regime of a qubit frequency space in accordance with one or more embodiments described herein. Repetitive description of like elements and/or processes employed in respective embodiments is omitted for sake of brevity.

At 802, computer-implemented method 800 can comprise coupling, by a system (e.g., a system comprising device 100 coupled to an AWG, a VNA, and/or a maser that can be coupled to computer 1012) operatively coupled to a processor (e.g., processing unit 1014, etc.), a first qubit (e.g., control qubit 102) to a second qubit (e.g., target qubit 104).

At 804, computer-implemented method 800 can comprise performing, by the system (e.g., a system comprising device 100 coupled to an AWG, a VNA, and/or a maser that can be coupled to computer 1012), a cross resonance operation (e.g., a cross-resonance gate operation) in a dispersive regime of a qubit frequency space based on the coupling (e.g., as described above with reference to FIG. 1).

At 806, computer-implemented method 800 can comprise adjusting, by the system (e.g., a system comprising device 100 coupled to an AWG, a VNA, and/or a maser that can be coupled to computer 1012), the coupling (e.g., the cross energy-participation ratio p described above with reference to FIG. 1) as a function of a detuning between a first operating frequency (e.g., operating frequency $\omega_0$) of the first qubit and a second operating frequency (e.g., operating frequency $\omega_2$) of the second qubit.

At 808, computer-implemented method 800 can comprise adjusting, by the system (e.g., a system comprising device 100 coupled to an AWG, a VNA, and/or a maser that can be coupled to computer 1012), the coupling (e.g., the cross energy-participation ratio p described above with reference to FIG. 1) as a function of a detuning between a first operating frequency (e.g., operating frequency $\omega_0$) of the first qubit and a second operating frequency (e.g., operating frequency $\omega_2$) of the second qubit such that, based on a fixed ratio of the coupling to the detuning (e.g., based on a fixed ratio of $J/\Delta$), a ratio of a defined dynamic entanglement rate (e.g., a defined ZX cross-resonance rate) to a defined spurious static entanglement rate (e.g., a defined ZZ interaction rate) is maintained.

At 810, computer-implemented method 800 can comprise mitigating, by the system (e.g., a system comprising device 100 coupled to an AWG, a VNA, and/or a maser that can be coupled to computer 1012), at least one of crosstalk or frequency collisions between at least one of the first qubit or the second qubit and an adjacent qubit based on the coupling and the performing.

Figure 9:
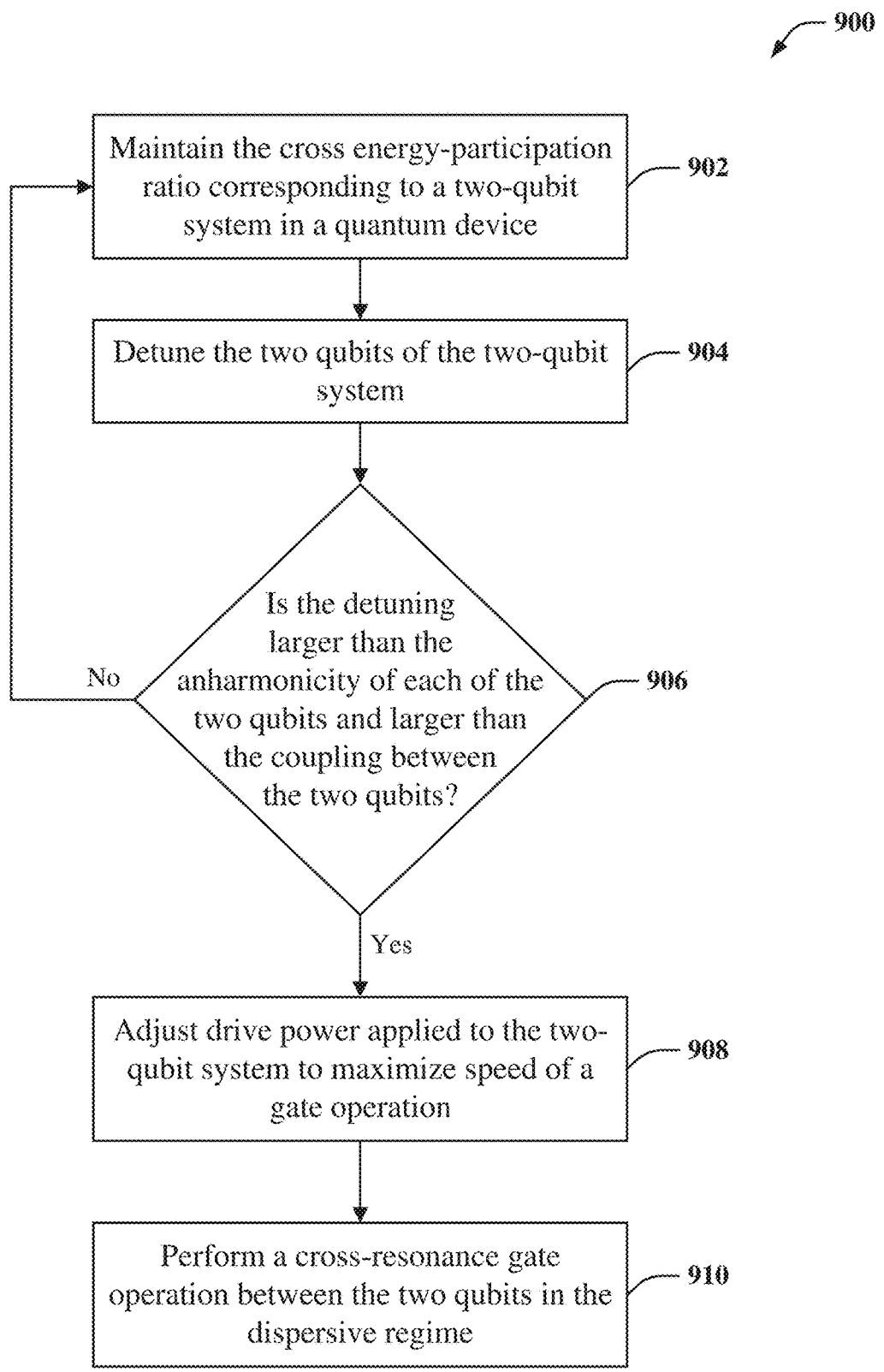

FIG. 9 illustrates a flow diagram of an example, non-limiting computer-implemented method 900 that can facilitate a cross-resonance operation in a dispersive regime of a qubit frequency space in accordance with one or more embodiments described herein. Repetitive description of like elements and/or processes employed in respective embodiments is omitted for sake of brevity.

At 902, computer-implemented method 900 can comprise maintaining (e.g., via a system comprising device 100 coupled to an AWG, a VNA, and/or a maser that can be coupled to computer 1012) the cross energy-participation ratio corresponding to a two-qubit system in a quantum device. For example, an entity as defined herein that can design, fabricate, and/or implement device 100 can maintain the cross energy-participation ratio p corresponding to a two-qubit system comprising control qubit 102 and target qubit 104 of device 100 as described above with reference to FIG. 1.

At 904, computer-implemented method 900 can comprise detuning (e.g., via a system comprising device 100 coupled to an AWG, a VNA, and/or a maser that can be coupled to computer 1012) the two qubits of the two-qubit system. For example, as described above with reference to FIG. 1, an entity as defined herein can design, fabricate, and/or implement device 100 such that the operating frequency $\omega_0$ of control qubit 102 is lower than the operating frequency $\omega_2$ of target qubit 104. In this example, such an entity can further design, fabricate, and/or implement device 100 such that control qubit 102 and target qubit 104 are far detuned from each other (e.g., $|\omega_0-\omega_2|\gg 0$) and/or target qubit 104 and spectator qubit 106 are far detuned from each other (e.g., $|\omega_2-\omega_1|\gg 0$).

At 906, computer-implemented method 900 can comprise determining (e.g., via a system comprising device 100 coupled to an AWG, a VNA, and/or a maser that can be coupled to computer 1012) whether the detuning is larger than the anharmonicity of each of the two qubits and larger than the coupling between the two qubits. For example, as described above with reference to FIG. 1, an entity as defined herein can design, fabricate, and/or implement device 100 such that the condition defined above as $J\ll\Delta_{02}\gg|\delta_0|, |\delta_2|$ is satisfied.

If it is determined at 906 that the detuning is larger than the anharmonicity of each of the two qubits and larger than the coupling between the two qubits, at 908, computer-implemented method 900 can comprise adjusting (e.g., via a system comprising device 100 coupled to an AWG, a VNA, and/or a maser that can be coupled to computer 1012) drive power (e.g., drive power 108) applied to the two-qubit system (e.g., applied to control qubit 102) to maximize speed of a gate operation. For example, as described above with reference to FIG. 1, to enable control qubit 102 and target qubit 104 to achieve maximum gate speed of a cross-resonance gate operation in the dispersive regime, such an entity that can design, fabricate and/or implement device 100 can adjust drive power 108 such that the value of the dimensionless drive parameter $\xi$ defined above in equation (4) is at or approximately at ½ (e.g., $\xi=\frac{1}{2}$ or $\xi\approx\frac{1}{2}$).

At 910, computer-implemented method 900 can comprise performing (e.g., via a system comprising device 100 coupled to an AWG, a VNA, and/or a maser that can be coupled to computer 1012) a cross-resonance gate operation between the two qubits in the dispersive regime. For example, as described above with reference to FIG. 1, an entity as defined herein that designs, fabricates, and/or implements device 100 such that the above defined condition $J\ll\Delta_{02}\gg|\delta_0|, |\delta_2|$ is satisfied can thereby enable control qubit 102 and target qubit 104 of device 100 to perform a cross-resonance gate operation in the dispersive regime.

If it is determined at 906 that the detuning is not larger than the anharmonicity of each of the two qubits and larger than the coupling between the two qubits, computer-implemented method 900 can comprise returning to 902 and 904 to maintain the cross energy-participation ratio p corresponding to the two-qubit system and detune the qubits such that the above defined condition $J<<\Delta_{02}>>|\delta_0|, |\delta_2|$ is satisfied. In some embodiments, computer-implemented method 900 can comprise repeating operations 902, 904, and 906 until the above defined condition $J<<\Delta_{02}>>|\delta_0|, |\delta_2|$ is satisfied, which can thereby enable control qubit 102 and target qubit 104 to perform a cross-resonance gate operation in the dispersive regime.

Figure 10:
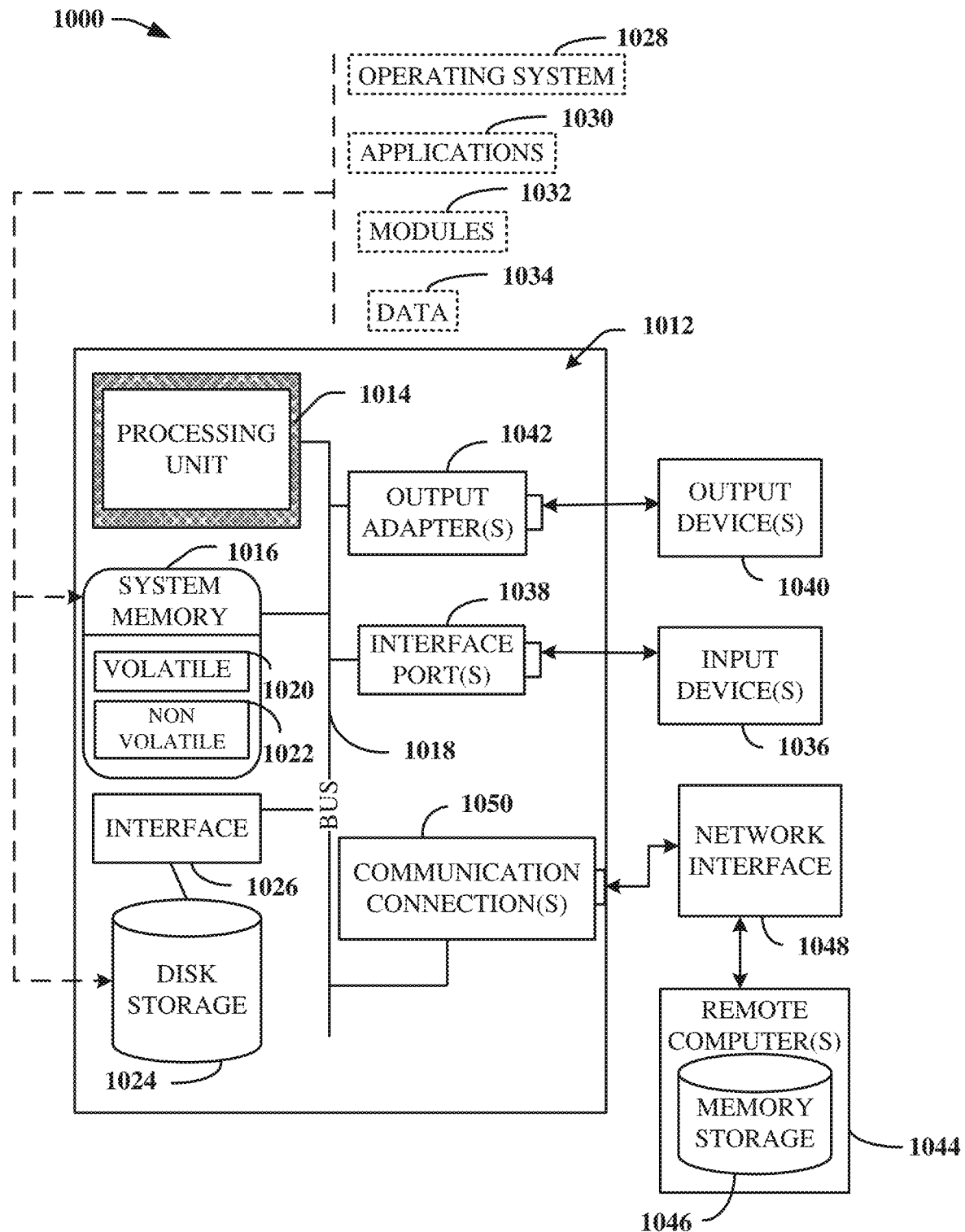
FIG. 10 illustrates a block diagram of an example, non-limiting operating environment in which one or more embodiments described herein can be facilitated.

In order to provide a context for the various aspects of the disclosed subject matter, FIG. 10 as well as the following discussion are intended to provide a general description of a suitable environment in which the various aspects of the disclosed subject matter can be implemented. FIG. 10 illustrates a block diagram of an example, non-limiting operating environment in which one or more embodiments described herein can be facilitated. For example, as described below, operating environment 1000 can be used to implement the example, non-limiting multi-step fabrication sequences described above with reference to FIGS. 1 and 2 that can be implemented to fabricate device 100 and/or device 200 in accordance with one or more embodiments of the subject disclosure as described herein. In another example, as described below, operating environment 1000 can be used to implement one or more of the example, non-limiting computer-implemented methods 500, 600, 700, 800, and/or 900 described above with reference to FIGS. 5, 6, 7, 8, and 9, respectively. Repetitive description of like elements and/or processes employed in other embodiments described herein is omitted for sake of brevity.

The example, non-limiting multi-step fabrication sequences described above with reference to FIGS. 1 and 2, which can be implemented to fabricate device 100 and/or device 200, can be implemented by a computing system (e.g., operating environment 1000 illustrated in FIG. 10 and described below) and/or a computing device (e.g., computer 1012 illustrated in FIG. 10 and described below). In non-limiting example embodiments, such a computing system (e.g., operating environment 1000) and/or such a computing device (e.g., computer 1012) can comprise one or more processors and one or more memory devices that can store executable instructions thereon that, when executed by the one or more processors, can facilitate performance of the example, non-limiting multi-step fabrication sequences described above with reference to FIGS. 1 and 2. As a non-limiting example, the one or more processors can facilitate performance of the example, non-limiting multi-step fabrication sequences described above with reference to FIGS. 1 and 2 by directing and/or controlling one or more systems and/or equipment operable to perform semiconductor and/or superconductor device fabrication.

In another example, one or more of the example, non-limiting computer-implemented methods 500, 600, 700, 800, and/or 900 described above with reference to FIGS. 5, 6, 7, 8, and 9, respectively, can also be implemented (e.g., executed) by operating environment 1000. As a non-limiting example, the one or more processors of such a computing device (e.g., computer 1012) can facilitate performance of one or more of the example, non-limiting computer implemented methods 500, 600, 700, 800, and/or 900 described above with reference to FIGS. 5, 6, 7, 8, and 9, respectively, by directing and/or controlling one or more systems and/or equipment (e.g., one or more types of the external device defined herein such as, for instance, an AWG, a VNA, a maser, etc.) operable to perform the operations and/or routines of such computer-implemented method(s).

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

With reference to FIG. 10, a suitable operating environment 1000 for implementing various aspects of this disclosure can also include a computer 1012. The computer 1012 can also include a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1016 can also include volatile memory 1020 and nonvolatile memory 1022. The basic input/output system (BIOS), containing the basic routines to transfer information between elements within the computer 1012, such as during start-up, is stored in nonvolatile memory 1022. Computer 1012 can also include removable/non-removable, volatile/non-volatile computer storage media. FIG. 10 illustrates, for example, a disk storage 1024. Disk storage 1024 can also include, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media. To facilitate connection of the disk storage 1024 to the system bus 1018, a removable or non-removable interface is typically used, such as interface 1026. FIG. 10 also depicts software that acts as an intermediary between users and the basic computer resources described in the suitable operating environment 1000. Such software can also include, for example, an operating system 1028. Operating system 1028, which can be stored on disk storage 1024, acts to control and allocate resources of the computer 1012.

System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems. A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port can be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a means of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a computer, a server, a router, a network PC, a workstation, a microprocessor based appliance, a peer device or other common network node and the like, and typically can also include many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1050 refers to the hardware/software employed to connect the network interface 1048 to the system bus 1018. While communication connection 1050 is shown for illustrative clarity inside computer 1012, it can also be external to computer 1012. The hardware/software for connection to the network interface 1048 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A quantum processing device, comprising:
   a first qubit having a first operating frequency and a first anharmonicity; and
   a second qubit that couples to the first qubit to perform a cross-resonance operation, the second qubit having a second operating frequency and a second anharmonicity, wherein a detuning between the first operating frequency and the second operating frequency is larger than the first anharmonicity and the second anharmonicity.

2. The quantum processing device of claim 1, wherein a coupling strength between the first qubit and the second qubit is adjusted for the detuning such that, based on a fixed ratio of the coupling strength to the detuning, a ratio of a defined dynamic entanglement rate to a defined spurious static entanglement rate is maintained.

3. The quantum processing device of claim 2, wherein the defined dynamic entanglement rate is generated by a ZX interaction or a ZY interaction and the defined spurious static entanglement rate is generated by a ZZ interaction.

4. The quantum processing device of claim 1, further comprising:
   multiple qubits organized in a lattice, the multiple qubits including neighboring qubits to the first qubit and the second qubit, wherein based on a second detuning between two coupled qubits in the lattice being larger than anharmonicities of the two coupled qubits, static frequency collisions in the lattice are mitigated.

5. The quantum processing device of claim 1, further comprising:
   multiple qubits organized in a lattice, the multiple qubits including neighboring qubits to the first qubit and the second qubit, wherein based on a second detuning between two coupled qubits in the lattice being larger than anharmonicities of the two coupled qubits, crosstalk resulting from dynamic collisions in the lattice are mitigated.

6. A computer-implemented method, comprising:
   coupling, by a system operatively coupled to a processor, a first qubit having a first operating frequency and a first anharmonicity to a second qubit having a second operating frequency and a second anharmonicity; and
   performing, by the system, a cross resonance operation based on the coupling, wherein a detuning between the first operating frequency and the second operating frequency is larger than the first anharmonicity and the second anharmonicity.

7. The computer-implemented method of claim 6, further comprising:
   adjusting, by the system, the coupling as a function of the detuning such that, based on a fixed ratio of the coupling to the detuning, a ratio of a defined dynamic entanglement rate to a defined spurious static entanglement rate is maintained.

8. The computer-implemented method of claim 7, wherein the defined dynamic entanglement rate is generated by a ZX interaction or a ZY interaction and the defined spurious static entanglement rate is generated by a ZZ interaction.

9. The computer-implemented method of claim 6, further comprising:
mitigating, by the system, static frequency collisions in a lattice of multiple qubits comprising neighboring qubits to the first qubit and the second qubit, wherein the mitigating is based on a second detuning between two coupled qubits in the lattice being larger than anharmonicities of the two coupled qubits.

10. The computer-implemented method of claim 6, further comprising:
mitigating, by the system, crosstalk resulting from dynamic collisions in a lattice of multiple qubits comprising neighboring qubits to the first qubit and the second qubit, wherein the mitigating is based on a second detuning between two coupled qubits in the lattice being larger than anharmonicities of the two coupled qubits.

11. A device, comprising:
a first qubit; and
a second qubit that couples to the first qubit to perform a cross resonance operation in a dispersive regime of a qubit frequency space.

12. The device of claim 11, wherein a coupling between the first qubit and the second qubit is adjusted as a function of a detuning between a first operating frequency of the first qubit and a second operating frequency of the second qubit that is larger than a first anharmonicity of the first qubit and a second anharmonicity of the second qubit.

13. The device of claim 12, wherein the coupling is adjusted such that, based on a fixed ratio of the coupling to the detuning, a ratio of a defined dynamic entanglement rate to a defined spurious static entanglement rate is maintained.

14. The device of claim 13, wherein the defined dynamic entanglement rate is generated by a ZX interaction or a ZY interaction and the defined spurious static entanglement rate is generated by a ZZ interaction.

15. The device of claim 11, wherein the second qubit couples to the first qubit to perform the cross resonance operation in the dispersive regime of the qubit frequency space to facilitate mitigation of at least one of crosstalk or frequency collisions between at least one of the first qubit or the second qubit and an adjacent qubit.

16. A computer-implemented method, comprising:
coupling, by a system operatively coupled to a processor, a first qubit to a second qubit; and
performing, by the system, a cross resonance operation in a dispersive regime of a qubit frequency space based on the coupling.

17. The computer-implemented method of claim 16, further comprising:
adjusting, by the system, the coupling as a function of a detuning between a first operating frequency of the first qubit and a second operating frequency of the second qubit.

18. The computer-implemented method of claim 16, further comprising:
adjusting, by the system, the coupling as a function of a detuning between a first operating frequency of the first qubit and a second operating frequency of the second qubit such that, based on a fixed ratio of the coupling to the detuning, a ratio of a defined dynamic entanglement rate to a defined spurious static entanglement rate is maintained.

19. The computer-implemented method of claim 18, wherein the defined dynamic entanglement rate is generated by a ZX interaction or a ZY interaction and the defined spurious static entanglement rate is generated by a ZZ interaction.

20. The computer-implemented method of claim 16, further comprising:
mitigating, by the system, at least one of crosstalk or frequency collisions between at least one of the first qubit or the second qubit and an adjacent qubit based on the coupling and the performing.

21. A device, comprising:
a first set of qubits having first operating frequencies;
a second set of qubits having second operating frequencies; and
a first qubit of the first set of qubits that couples to a second qubit of the second set of qubits to perform a cross resonance operation in a dispersive regime of a qubit frequency space.

22. The device of claim 21, wherein a coupling between the first qubit and the second qubit is adjusted as a function of a detuning between a first operating frequency of the first qubit and a second operating frequency of the second qubit that is larger than a first anharmonicity of the first qubit and a second anharmonicity of the second qubit.

23. The device of claim 22, wherein the coupling is adjusted such that, based on a fixed ratio of the coupling to the detuning, a ratio of a defined dynamic entanglement rate to a defined spurious static entanglement rate is maintained.

24. The device of claim 23, wherein the defined dynamic entanglement rate is generated by a ZX interaction or a ZY interaction and the defined spurious static entanglement rate is generated by a ZZ interaction.

25. The device of claim 21, wherein the second qubit couples to the first qubit to perform the cross resonance operation in the dispersive regime of the qubit frequency space to facilitate mitigation of at least one of crosstalk or frequency collisions between at least one of the first qubit or the second qubit and one or more adjacent qubits.

* * * * *